US009412680B2

(12) United States Patent
Gohara et al.

(10) Patent No.: US 9,412,680 B2
(45) Date of Patent: Aug. 9, 2016

(54) SEMICONDUCTOR MODULE AND ELECTRICALLY-DRIVEN VEHICLE

(71) Applicant: FUJI ELECTRIC CO., LTD., Kawasaki-shi (JP)

(72) Inventors: Hiromichi Gohara, Matsumoto (JP); Nobuhide Arai, Matsumoto (JP); Shinichiro Adachi, Matsumoto (JP); Yoshitaka Nishimura, Azumino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/968,253

(22) Filed: Dec. 14, 2015

(65) Prior Publication Data
US 2016/0099194 A1 Apr. 7, 2016

Related U.S. Application Data

(63) Continuation of application No. PCT/JP2014/079322, filed on Nov. 5, 2014.

(30) Foreign Application Priority Data

Dec. 19, 2013 (JP) .................................. 2013-262227

(51) Int. Cl.
*H01L 23/48* (2006.01)
*H01L 23/373* (2006.01)
(Continued)

(52) U.S. Cl.
CPC ............ *H01L 23/3735* (2013.01); *H01L 23/36* (2013.01); *H01L 23/467* (2013.01);
(Continued)

(58) Field of Classification Search
CPC ... H01L 23/36; H01L 23/3735; H01L 23/467; H01L 23/473; H01L 25/07; H01L 25/18
See application file for complete search history.

(56) References Cited

U.S. PATENT DOCUMENTS 7,057,275 B2 * 6/2006 Schwarzbauer ...... H01L 25/072
257/691
7,799,614 B2 * 9/2010 Otremba ............. H01L 23/5389
257/687

(Continued)

FOREIGN PATENT DOCUMENTS

JP 2003-179204 A 6/2003
JP 2009-272482 A 11/2009

(Continued)

OTHER PUBLICATIONS

PCT, "International Search Report for International Application No. PCT/JP2014/079322".

*Primary Examiner* — Nicholas Tobergte
(74) *Attorney, Agent, or Firm* — Manabu Kanesaka

(57) ABSTRACT

A semiconductor module includes a first semiconductor element, a second semiconductor element, a first heat spreader electrically and thermally connected to the first semiconductor element, a second heat spreader electrically and thermally connected to the second semiconductor element, a DCB substrate including a first metal foil on a top surface of a ceramic insulating substrate and including a second metal foil on a bottom surface, the first metal foil being electrically and thermally joined to the first heat spreader and the second heat spreader, and a cooler thermally connected to the second metal foil of the DCB substrate. The first semiconductor element is disposed on an upstream side, and the second semiconductor element is disposed on a downstream side with respect to a flowing direction of a refrigerant of the cooler. An area of the second heat spreader is greater than an area of the first heat spreader.

17 Claims, 17 Drawing Sheets

(51) Int. Cl.
*H01L 23/36* (2006.01)
*H01L 25/07* (2006.01)
*H01L 25/18* (2006.01)
*H01L 23/467* (2006.01)
*H01L 23/473* (2006.01)

(52) U.S. Cl.
CPC .............. *H01L23/473* (2013.01); *H01L 25/07* (2013.01); *H01L 25/18* (2013.01); *H01L 2224/32225* (2013.01); *H01L 2924/13055* (2013.01)

(56) References Cited

U.S. PATENT DOCUMENTS

| | | | |
|---|---|---|---|
| 8,450,845 B2* | 5/2013 | Ikeda | H01L 23/3735 257/706 |
| 8,461,645 B2* | 6/2013 | Otremba | H01L 23/3735 257/328 |
| 9,018,744 B2* | 4/2015 | Otremba | H01L 23/49541 257/676 |
| 2010/0172091 A1 | 7/2010 | Nishiura | |
| 2010/0230800 A1 | 9/2010 | Beaupre et al. | |
| 2011/0049535 A1 | 3/2011 | Soeno | |
| 2011/0242761 A1 | 10/2011 | Tonomoto | |
| 2012/0018741 A1 | 1/2012 | Sato | |

FOREIGN PATENT DOCUMENTS

| | | |
|---|---|---|
| JP | 2010-010505 A | 1/2010 |
| JP | 2010-153785 A | 7/2010 |
| JP | 2011-211017 A | 10/2011 |
| JP | 2011-211018 A | 10/2011 |
| JP | 2011-228638 A | 11/2011 |
| JP | 2012-044140 A | 3/2012 |
| JP | 2012-212776 A | 11/2012 |
| JP | 2013-128051 A | 6/2013 |
| JP | 2013-143408 A | 7/2013 |
| JP | 2013-191806 A | 9/2013 |

* cited by examiner

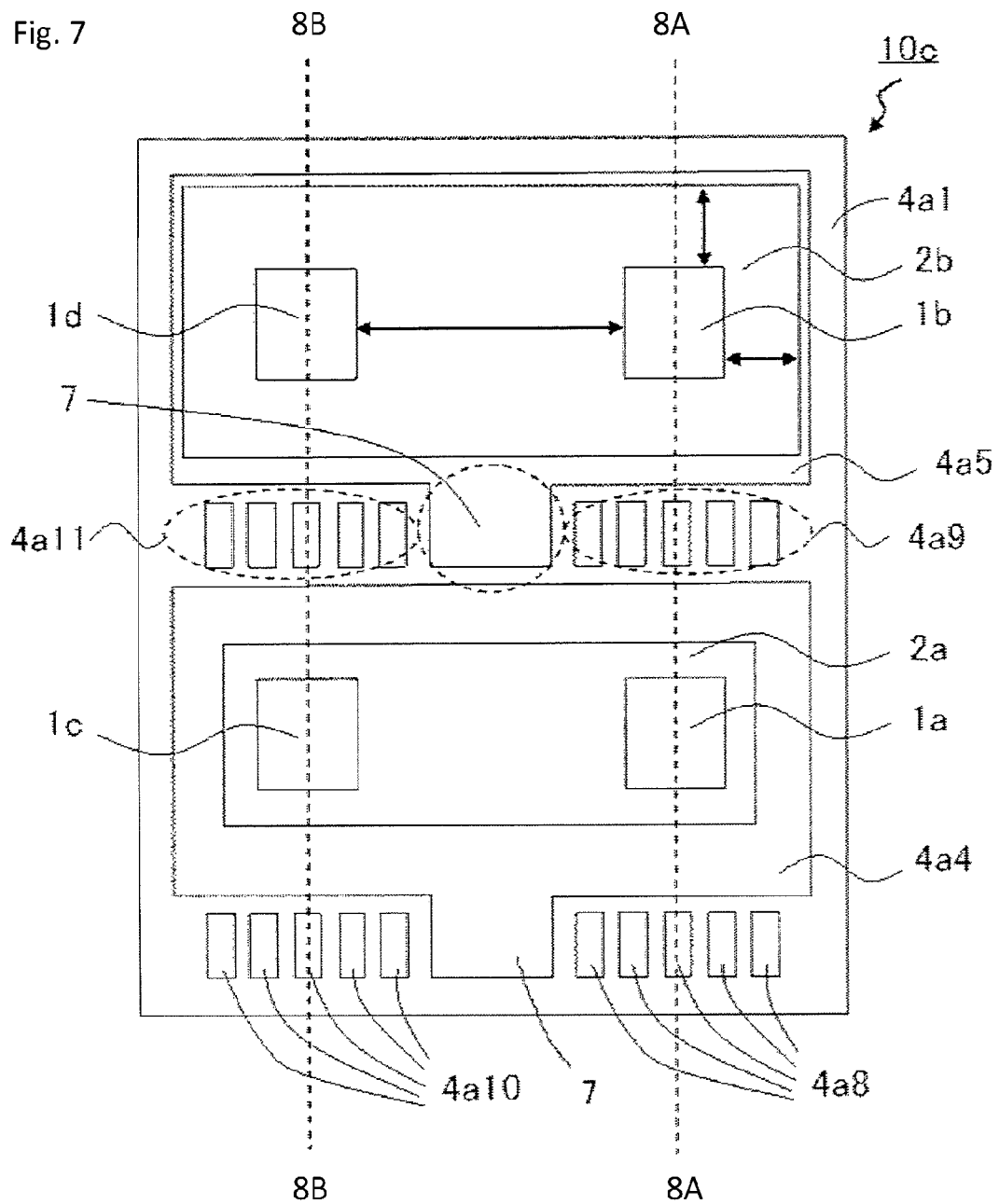

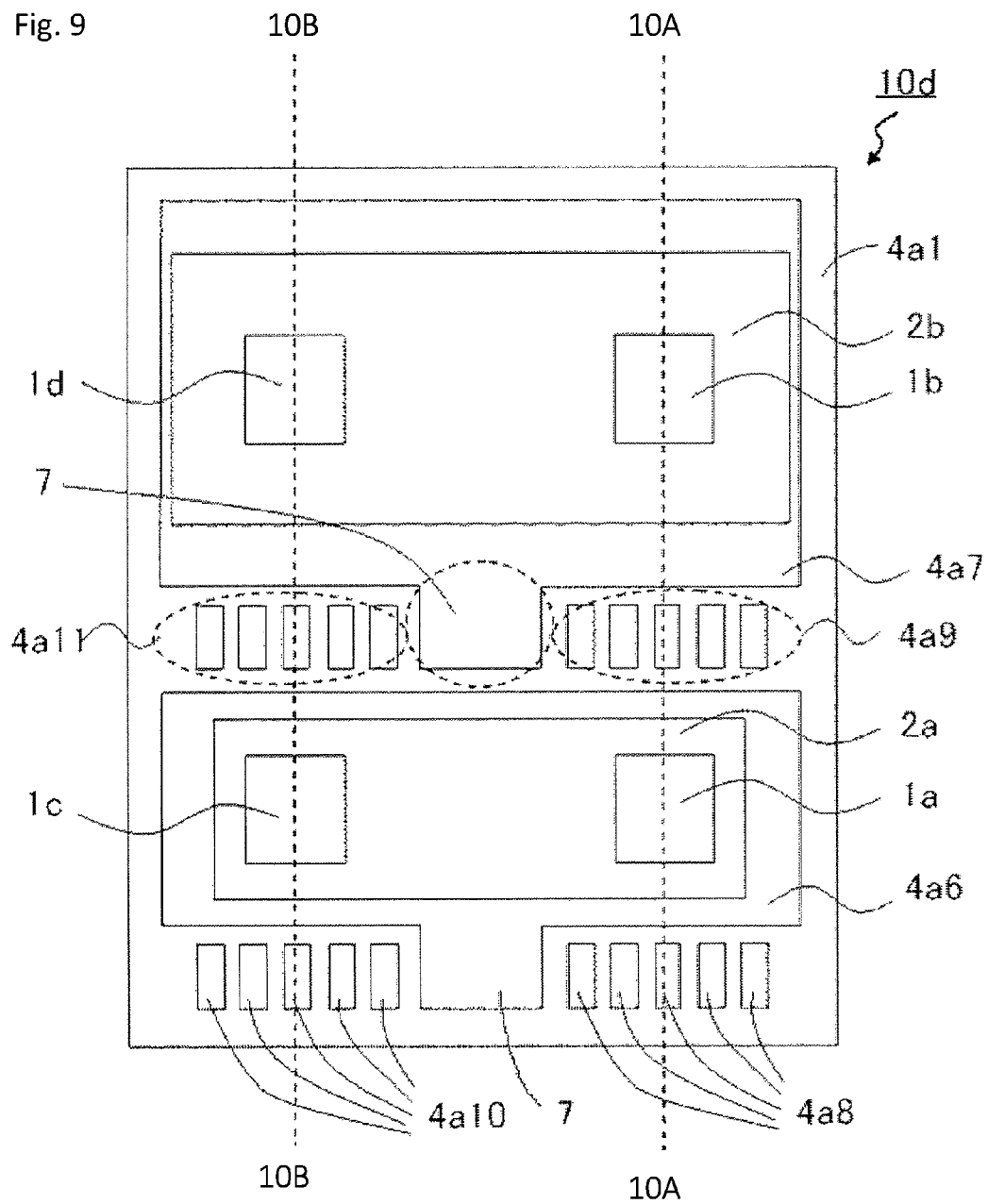

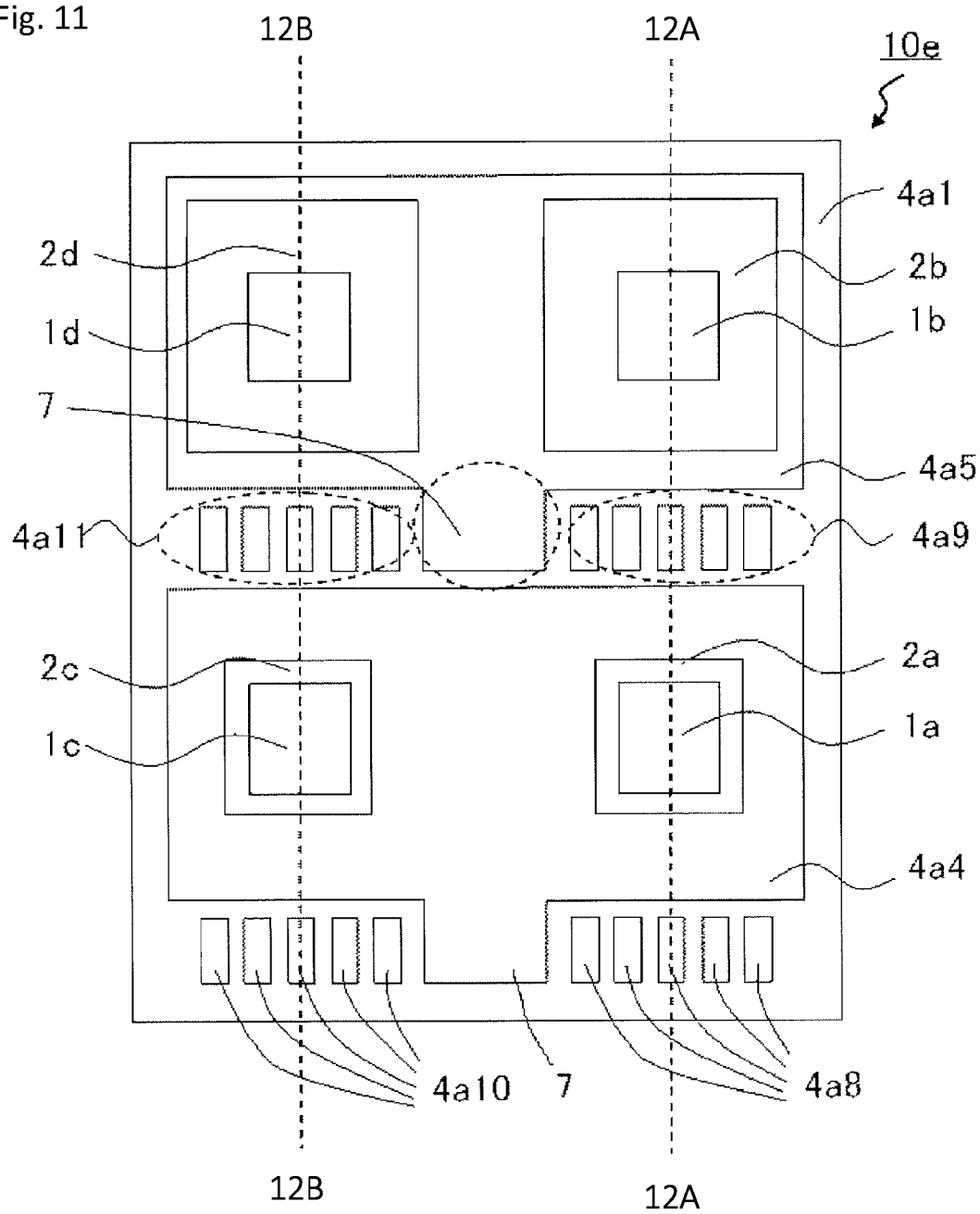

| | HEAT SPREADER THICKNESS (mm) | SOLDER THICKNESS (mm) | METAL FOIL THICKNESS (mm) | DISTANCE FROM TOP SURFACE OF CERAMIC INSULATING SUBSTRATE TO TOP SURFACE OF SECOND HEAT SPREADER (mm) | SEMICONDUCTOR ELEMENT MAXIMUM TEMPERATURE Tj (°C) |
|---|---|---|---|---|---|
| No.1 | 0.1 | 0.1 | 0.4 | 0.6 | — |
| No.2 | 0.3 | 0.1 | 0.4 | 0.8 | 171.6 |
| No.3 | 0.7 | 0.1 | 0.4 | 1.2 | 164.4 |
| No.4 | 1.0 | 0.1 | 0.4 | 1.5 | 162.2 |
| No.5 | 1.5 | 0.1 | 0.4 | 2.0 | 161.8 |
| No.6 | 2.0 | 0.1 | 0.4 | 2.5 | 160.8 |
| No.7 | 2.5 | 0.1 | 0.4 | 3.0 | 159.8 |

INTERVAL BETWEEN SEMICONDUCTOR ELEMENT END
AND HEAT SPREADER EXTERNAL FORM (mm)

SEMICONDUCTOR MODULE AND ELECTRICALLY-DRIVEN VEHICLE

CROSS-REFERENCES TO RELATED APPLICATIONS

The present application is a Continuation Application of PCT International Application No. PCT/JP2014/079322 filed Nov. 5, 2014, and claiming priority from Japanese Application No. 2013-262227 filed Dec. 19, 2013, the disclosure of which is incorporated herein.

TECHNICAL FIELD

The present invention relates to a semiconductor module with superior cooling capacity, and to an electrically-driven vehicle in which the semiconductor module is used.

BACKGROUND ART

PTLs 1 to 6 are known as devices that cool a plurality of semiconductor elements.

An inverter circuit cooling device wherein a heat transfer plate formed of aluminum or the like is provided on the top surface of a box-form housing, six power semiconductors are disposed on the heat transfer plate, the interior of the housing is divided into a first refrigerant chamber and a second refrigerant chamber by an intermediate plate including a communication hole, a refrigerant inlet is provided in one end portion in the first refrigerant chamber, a refrigerant outlet is provided in the other end portion in the second refrigerant chamber, six of the communication hole are provided in each cooling region, the aperture area of the communication hole is small on an upstream side near the refrigerant inlet, and the aperture area of the communication hole is large on a downstream side far from the refrigerant inlet, whereby the six power semiconductors are more evenly cooled, is disclosed in PTL 1.

A semiconductor cooler wherein a plurality of plate-form fins of differing lengths is disposed so that the density of heat radiating fins formed on the surface of a metal base on the side opposite to that of a semiconductor chip mounting surface increases in the direction of flow of a refrigerant, whereby the tendency of the refrigerant and a semiconductor chip to rise in temperature along the direction of flow is restricted, and the temperatures of semiconductor chips disposed in the direction of flow of the refrigerant can be brought near to uniform, is disclosed in PTL 2.

A semiconductor module formed of two semiconductor chips, two metal blocks, and three heat radiating plates, whereby cooling performance is increased, is disclosed in PTLs 3 and 4.

A semiconductor device unit wherein adhesion between the back surface of a unit assembly and a refrigerant is improved, thereby reducing the thermal contact resistance between the back surface of the unit assembly and the refrigerant, is disclosed in PTL 5.

A power module wherein the type and material characteristics of an insulating substrate having a conductor layer to which is attached a power semiconductor element, and the material and thickness of conductor layers positioned on the front and back surfaces of the insulating substrate, are specified, thereby maintaining operating stability and improving assembling ability even in a high temperature environment, is disclosed in PTL 6.

CITATION LIST

Patent Literature

PTL 1: JP-A-2013-128051
PTL 2: JP-A-2010-153785
PTL 3: JP-A-2011-211017
PTL 4: JP-A-2011-228638
PTL 5: JP-A-2013-191806
PTL 6: JP-A-2010-10505

SUMMARY OF INVENTION

Technical Problem

As the cooling device of PTL 1 is formed such that the housing is divided vertically into two levels, thereby providing the first refrigerant chamber and second refrigerant chamber, there is a problem in that the device dimensions increase.

As the semiconductor cooler of PTL 2 is formed such that a complex structure that changes the plate-form fin installation density is necessary, there is a problem in that the manufacturing cost increases.

With the semiconductor module of PTL 3 and PTL 4, there is a problem in that a plurality of semiconductor elements cannot be disposed in a planar arrangement on a ceramic substrate.

A method whereby a connection unit of a semiconductor module and a cooler is improved, thereby improving cooling capacity, is described in PTL 5 and PTL 6, but there is no disclosure of a method whereby in-plane disparity of the cooling capacity is reduced by improvement of the connection unit.

In order to resolve the heretofore described problems, an object of the invention is to provide a semiconductor module wherein in-plane disparity of cooling capacity caused by the direction of flow of a refrigerant flowing through a semiconductor module cooler is reduced, and cooling efficiency is good.

Solution to Problem

The inventor arrived at the invention by finding that it is a ceramic insulating substrate that controls the rate of heat dispersion, and finding that the size of a semiconductor module can be reduced by eliminating as far as possible the difference in temperature between an upstream semiconductor element and a downstream semiconductor element.

In order to resolve the heretofore described problems, a semiconductor module of the invention includes a first semiconductor element, a second semiconductor element, a first heat spreader electrically and thermally connected to the bottom surface of the first semiconductor element, a second heat spreader electrically and thermally connected to the bottom surface of the second semiconductor element, a DCB substrate including a ceramic insulating substrate, a first metal foil disposed on the top surface of the ceramic insulating substrate, and a second metal foil disposed on the bottom surface of the ceramic insulating substrate, wherein the first metal foil is electrically and thermally joined to the bottom surface of the first heat spreader and the bottom surface of the second heat spreader, and a cooler thermally connected to the second metal foil of the DCB substrate. The first semiconductor element is disposed on the upstream side, and the second semiconductor element is disposed on the downstream side, with respect to the direction of flow of a refrigerant of the cooler, and the area of the second heat spreader is greater than the area of the first heat spreader.

According to this kind of configuration, the refrigerant temperature rises heading downstream from upstream, because of which the difference in temperature between the second heat spreader and the refrigerant is smaller than the difference in temperature between the first heat spreader and the refrigerant, but by the heat transfer area of the second heat spreader being greater than the heat transfer area of the first heat spreader, the amount of heat transferred becomes uniform, the thermal efficiency of the whole module improves, and the external size of the semiconductor module can be reduced.

The semiconductor module of the invention is formed such that it is preferable that the length of the second heat spreader in a direction perpendicular to the flow of the refrigerant is greater than the length of the first heat spreader in the direction perpendicular to the flow of the refrigerant.

The semiconductor module of the invention is formed such that it is preferable that the length of the second heat spreader in the direction of flow of the refrigerant is greater than the length of the first heat spreader in the direction of flow of the refrigerant.

According to this kind of configuration, the heat transfer area of the second heat spreader is greater than the heat transfer area of the first heat spreader, and for the same reason as that heretofore described, the thermal efficiency of the whole module improves, and the external size of the semiconductor module can be reduced.

The semiconductor module of the invention is formed such that the first metal foil can be divided into a third metal foil disposed on the bottom surface of the first heat spreader and a fourth metal foil disposed on the bottom surface of the second heat spreader.

According to this kind of configuration, connection points of back surface electrodes of the first semiconductor element and second semiconductor element can be set individually, because of which a plurality of semiconductor elements of differing types can be incorporated in one semiconductor unit.

The semiconductor module of the invention is formed such that the first semiconductor element and/or second semiconductor element can be formed of a plurality of semiconductor elements disposed electrically connected in parallel.

According to this kind of configuration, either one of the first semiconductor element or second semiconductor element, or both the first semiconductor element and second semiconductor element, can be formed of a plurality of semiconductor elements disposed electrically connected in parallel, whereby the capacity of the semiconductor unit can be increased.

The semiconductor module of the invention is formed such that the first heat spreader and/or second heat spreader can be divided into one for each of the plurality of semiconductor elements disposed electrically connected in parallel.

According to this kind of configuration, either one of the first heat spreader or second heat spreader, or both the first heat spreader and second heat spreader, are divided into one for each semiconductor element, even when the semiconductor elements are disposed electrically connected in parallel, because of which thermal interference between semiconductor elements is unlikely to occur. Herein, the parallel connection of the plurality of semiconductor elements may be arranged such that different types of semiconductor element are connected in parallel, for example, a structure wherein an IGBT and an FWD are connected in parallel may be adopted.

The semiconductor module of the invention is formed such that, furthermore, the first metal foil can include an extending portion protruding in a direction from downstream to upstream of the refrigerant flow in a region between the plurality of semiconductor elements electrically connected in parallel.

According to this kind of configuration, the first metal foil is extended to a position distanced from the heat spreaders, because of which wiring can easily be connected to the first metal foil.

The semiconductor module of the invention is formed such that an electrode pad is disposed on the ceramic insulating substrate between the first semiconductor element and the second semiconductor element.

According to this kind of configuration, an electrode pad is disposed in an empty region provided in order to restrict reciprocal thermal interference between the first semiconductor element and second semiconductor element, because of which space can be effectively utilized. Also, as the electrode pad is disposed in a position near the semiconductor elements, a current path when extracting a signal from the electrode pad to the exterior can be shortened.

The semiconductor module of the invention is formed such that it is preferable that the external form of the first heat spreader is in a range between 2 mm or more and 10 mm or less, from an end of the first semiconductor element, and the external form of the second heat spreader is in a range between 2 mm or more and 10 mm or less, from an end of the second semiconductor element.

According to this kind of configuration, heat can be dispersed effectively by the heat spreaders, because of which the external size of the semiconductor module can be reduced.

The semiconductor module of the invention is formed such that it is preferable that each of the distance from the top surface of the ceramic insulating substrate to the top surface of the first heat spreader and the distance from the top surface of the ceramic insulating substrate to the top surface of the second heat spreader is between 0.8 mm or more and 2.5 mm or less, the external form of the first heat spreader has a size between 2 mm or more and 5 mm or less, from an end of the first semiconductor element, and the external form of the second heat spreader has a size between 2 mm or more and 5 mm or less, from an end of the second semiconductor element.

Furthermore, the semiconductor module of the invention is formed such that it is preferable that each of the distance from the top surface of the ceramic insulating substrate to the top surface of the first heat spreader and the distance from the top surface of the ceramic insulating substrate to the top surface of the second heat spreader is between 1.5 mm or more and 2.0 mm or less, the external form of the first heat spreader has a size between 2 mm or more and 5 mm or less, from an end of the first semiconductor element, and the external form of the second heat spreader has a size between 2 mm or more and 5 mm or less, from an end of the second semiconductor element.

According to this kind of configuration, by the distance from the top surface of the ceramic insulating substrate to the top surface of the heat spreaders being less than 0.8 mm, a problem wherein the electrode electrical resistance increases and the temperature when energizing increases, and a problem wherein DCB substrate manufacture becomes difficult due to the distance exceeding 2.5 mm, can be avoided, and the amount of heat transferred by the first heat spreader and the amount of heat transferred by the second heat spreader can be equalized, because of which thermal efficiency improves, and the external size of the semiconductor module can be further reduced.

The semiconductor module of the invention is formed such that it is preferable that each of the distance between edges of the plurality of first semiconductor elements facing each other and the distance between edges of the plurality of second semiconductor elements facing each other is between 1 mm or more and 13 mm or less.

According to this kind of configuration, a problem wherein thermal interference between the semiconductor elements increases when the distance between edges of the semiconductor elements facing each other is less than 1 mm, and a problem wherein it becomes difficult to increase the distance between the semiconductor elements, and cooling efficiency per area decreases, when the distance exceeds 13 mm, can be avoided.

The semiconductor module of the invention is formed such that at least one, or both, of the first semiconductor element and second semiconductor element can include a first sensor that measures either current or voltage and a second sensor that measures temperature.

According to this kind of configuration, the semiconductor element current, voltage, and temperature can be monitored.

The semiconductor module of the invention is formed such that it is preferable that the area of the second heat spreader is increased in a range between 1.2 times or more and 2.4 times or less than the area of the first heat spreader.

Furthermore, the semiconductor module of the invention is formed such that it is more preferable that the area of the second heat spreader is increased in a range between 1.5 times or more and 2.1 times or less than the area of the first heat spreader.

The semiconductor module of the invention is formed such that it is particularly preferable that the area of the second heat spreader is increased in a range between 1.8 times or more and 2.0 times or less than the area of the first heat spreader.

According to this kind of configuration, the areas of the first heat spreader and second heat spreader can be optimized, and the external size of the semiconductor module can be reduced.

An electrically-driven vehicle of the invention is characterized by including the semiconductor module according to any embodiment, a motor driven by power output by the semiconductor module, a central processing unit that controls the semiconductor module, a pump that transports refrigerant that cools the semiconductor module, a heat exchanger that cools the refrigerant, and piping that connects the semiconductor module, the pump, and the heat exchanger in closed circuit form, thereby forming a refrigerant path.

According to this kind of configuration, the external size of the semiconductor module can be reduced, because of which the volume occupied by the semiconductor module when mounted in a vehicle can be reduced.

Advantageous Effects of Invention

According to the invention, a semiconductor module wherein in-plane disparity of cooling capacity caused by the direction of flow of a refrigerant flowing through a semiconductor module cooler is reduced, and any semiconductor element can be cooled uniformly, because of which cooling efficiency is good, and the external size of the semiconductor module can be further reduced. Therefore, when the semiconductor module of the invention is mounted in a vehicle, designing the distribution of mounted parts is easier, and passenger space inside the vehicle can be increased.

BRIEF DESCRIPTION OF DRAWINGS

FIG. 7 is a plan view according to another example of the semiconductor unit of the invention.

FIG. 9 is a plan view according to another example of the semiconductor unit of the invention.

FIG. 11 is a plan view according to another example of the semiconductor unit of the invention.

DESCRIPTION OF EMBODIMENTS

Figure 1:
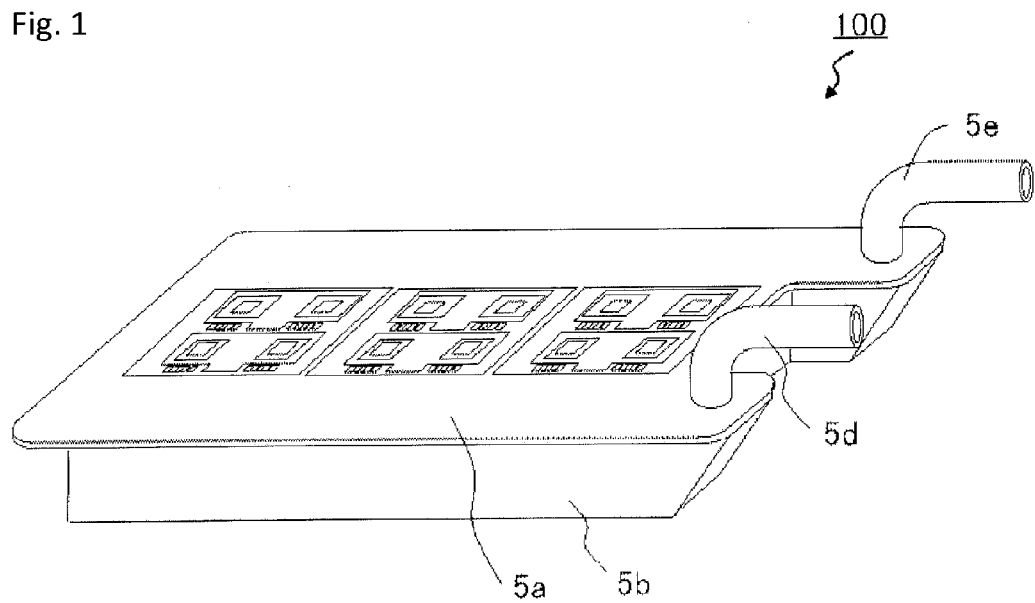
FIG. 1 is a perspective view showing an outline configuration of a semiconductor module of the invention.

Hereafter, while referring to the drawings, an embodiment of a semiconductor module according to the invention will be described. The same reference signs are given to identical components, and redundant descriptions are omitted. The invention, not being limited by the embodiment, can be modified and implemented as appropriate without departing from the scope of the invention.

In each example of the invention, a semiconductor element 1, although not particularly limited, may be, for example, an IGBT (Insulated Gate Bipolar Transistor), power MOSFET (Metal-Oxide-Semiconductor Field Effect Transistor), or FWD (Free Wheeling Diode), and these may be an RC-IGBT (Reverse Conducting-Insulated Gate Bipolar Transistor) realized in one semiconductor element.

Figure 2:
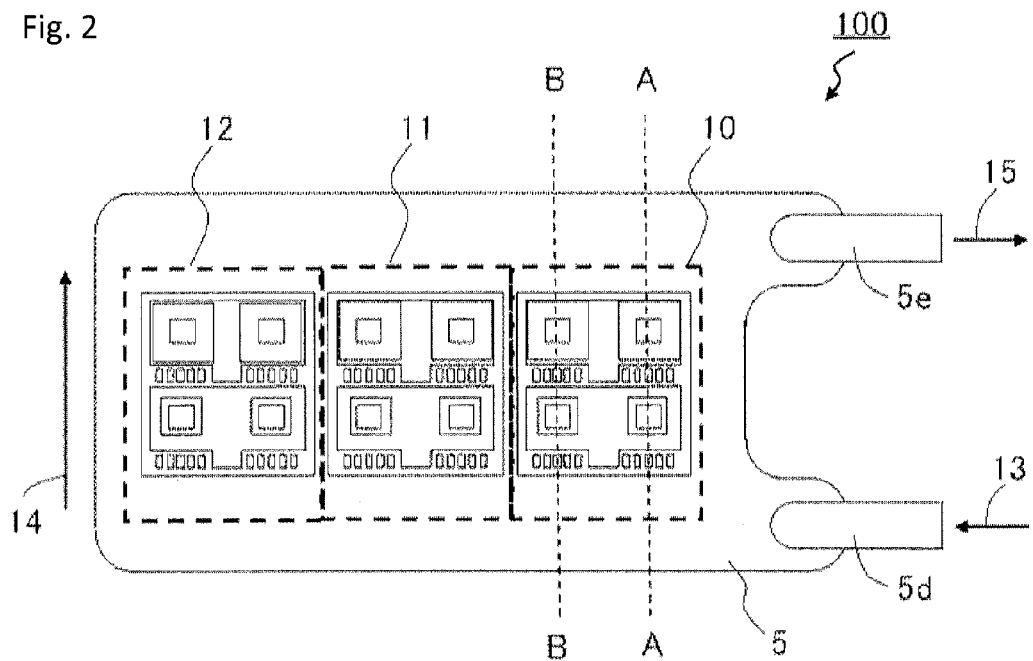
FIG. 2 is a plan view of the semiconductor module shown in FIG. 1

FIG. 1 is a perspective view showing an outline configuration of a semiconductor module of the invention. Also, FIG. 2 is a plan view of the semiconductor module. Meanwhile, FIG. 4 is a sectional view according to an example of a semiconductor unit of the invention.

An example wherein a semiconductor module 100 includes three semiconductor units 10, 11, and 12 is shown in FIG. 1. The semiconductor module 100 may equally well include one, or two or more, semiconductor units.

Figure 4:
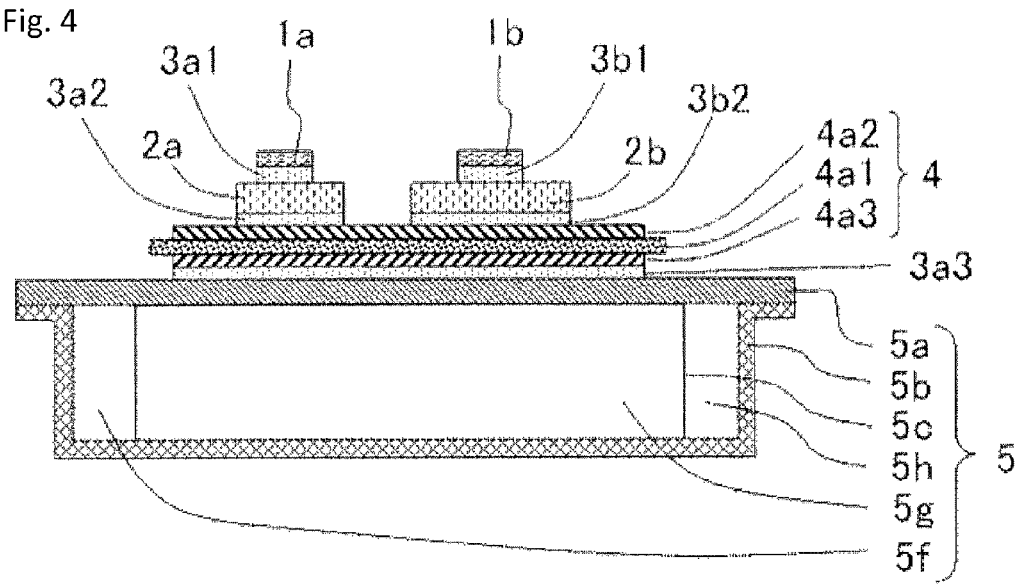
FIG. 4 is a sectional view along the line 4-4 of the semiconductor unit shown in FIG. 3.

As shown in FIG. 1, FIG. 2, and FIG. 4, the semiconductor module 100 includes a cooler 5, a top plate 5a, a tray 5b, a fin 5c, refrigerant inlet piping 5d, a refrigerant path 5g, and refrigerant outlet piping 5e, and the semiconductor units 10, 11, and 12 are disposed on the top plate 5a of the cooler 5. The top plate 5a of the cooler 5 is thermally connected to a second metal foil 4a3 of the semiconductor units 10, 11, and 12, whereby heat from the semiconductor units 10, 11, and 12 is transferred to the top plate 5a of the cooler 5. The tray 5b is disposed below the top plate 5a, and a plurality of the fin 5c is arrayed in the tray 5b. The fin 5c shown in the drawing has a plate form, but not being limited to this, for example, the fin 5c may have a wave form, a lattice form, or porous. The fin 5c is connected to the top plate 5a and tray 5b. There is a space between left and right end portions of the fin 5c and the tray 5b, wherein a refrigerant inlet piping-side distribution portion 5f and a refrigerant outlet piping-side collection portion 5h are formed. In the cooler 5, the refrigerant is introduced from a refrigerant introduction direction 13 through the refrigerant inlet piping 5d, the refrigerant is distributed among the fins 5c in the refrigerant inlet piping-side distribution portion 5f, flows in a refrigerant flow direction 14 along the refrigerant path 5g among the fins 5c, and is heated by the top plate 5b and fins 5c, and the refrigerant emerging from among the fins 5c is collected in the refrigerant outlet piping-side collection portion 5h, and is discharged in a refrigerant discharge direction 15 through the refrigerant outlet piping 5e. The refrigerant is circulated along a circular path via the refrigerant outlet piping 5e of the cooler 5, and a heat exchanger and pump (not shown), returning to the refrigerant inlet piping 5d of the cooler 5. The refrigerant not being particularly limited, for example, a liquid refrigerant such as an ethylene glycol solution or water, a vapor refrigerant such as air, or a refrigerant capable of phase change that vaporizes in a cooler and chills the cooler with vaporization heat, as in the case of Freon, can be used.

An example wherein a semiconductor unit 10e of FIG. 11 is used in the semiconductor module 100 is shown in FIG. 2, but there are different variations of semiconductor unit, as shown in the following examples. Any semiconductor unit includes a DCB substrate on the lower side of a heat spreader. DCB is an abbreviation of Direct Copper Bonding, and is formed such that a metal foil of copper or the like is joined directly to a ceramic insulating substrate. A ceramic material such as aluminum nitride (AlN) is used for the material of a ceramic insulating substrate 2a; however, the material is not particularly limited provided that insulation can be secured.

Also, in the following examples, the first semiconductor unit 10, second semiconductor unit 11, and third semiconductor unit 12 are sealed with a sealing resin (not shown). The first semiconductor unit 10, second semiconductor unit 11, and third semiconductor unit 12 may be individually sealed with resin, or may be sealed together with resin as one. In order to reduce unnecessary cost due to a manufacturing mistake, individually sealing with resin is more desirable. For example, an epoxy resin, or the like, is preferably used as the sealing resin, but the material is not particularly limited provided that it has a predetermined insulating performance and good formability.

Every example of the semiconductor module of the invention includes a first semiconductor element, a second semiconductor element, a first heat spreader electrically and thermally connected to the bottom surface of the first semiconductor element, a second heat spreader electrically and thermally connected to the bottom surface of the second semiconductor element, a DCB substrate including a ceramic insulating substrate, a first metal foil disposed on the top surface of the ceramic insulating substrate, and a second metal foil disposed on the bottom surface of the ceramic insulating substrate, wherein the first metal foil is electrically and thermally joined to the bottom surface of the first heat spreader and the bottom surface of the second heat spreader, and a cooler thermally connected to the second metal foil of the DCB substrate, wherein the first semiconductor element is disposed on the upstream side, and the second semiconductor element is disposed on the downstream side, with respect to the direction of flow of a refrigerant of the cooler, and the area of the second heat spreader is greater than the area of the first heat spreader.

In the following examples, various modification examples of the first semiconductor unit 10 are shown. The structure of the semiconductor module according to the examples of the invention will be described using sectional views crossing the first semiconductor element and second semiconductor element. Foils having a thickness of 0.4 mm are used for the first metal foil, second metal foil, a third metal foil, and a fourth metal foil.

First Embodiment

A first embodiment according to the invention will be described.

The semiconductor module 100 according to the first embodiment of the invention includes the first semiconductor unit 10, second semiconductor unit 11, third semiconductor unit 12, and cooler 5. The first semiconductor unit 10a, to be described hereafter, is used as the first semiconductor unit 10, second semiconductor unit 11, and third semiconductor unit 12. As the cooler 5 is as heretofore described, a description thereof will be omitted.

Figure 3:
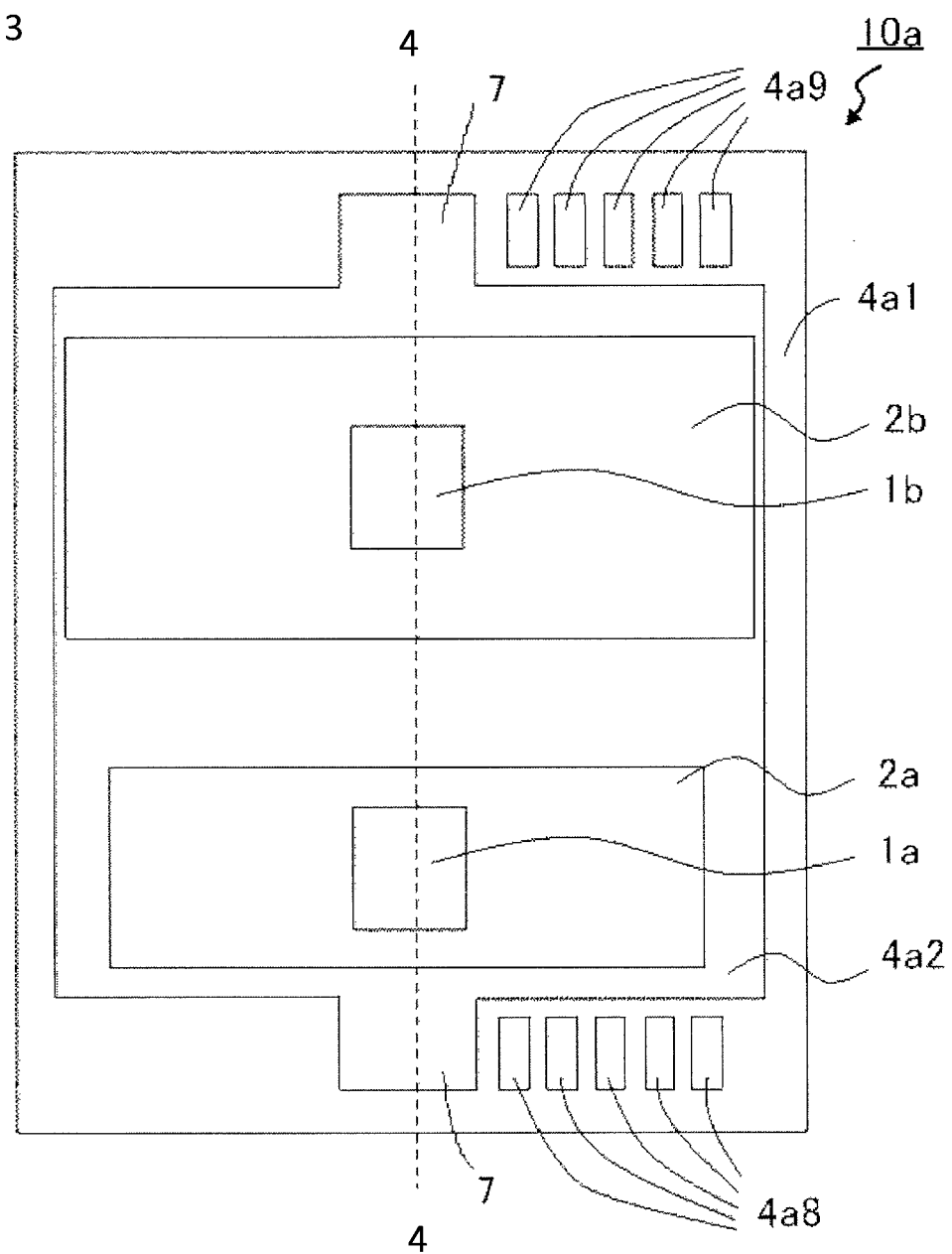
FIG. 3 is a plan view according to an example of a semiconductor unit of the invention.

FIG. 3 shows a plan view of the semiconductor unit 10a according to the first embodiment of the invention. Also, FIG.

4 shows a sectional view along the line 4-4 of the semiconductor unit 10a shown in FIG. 3 and the cooler 5.

The first semiconductor unit 10a includes a first semiconductor element 1a, a second semiconductor element 1b, a first heat spreader 2a, a second heat spreader 2b, solder 3a1, solder 3a2, solder 3a3, solder 3b1, solder 3b2, a DCB substrate 4, a ceramic insulating substrate 4a1, a first metal foil (circuit layer) 4a2, a second metal foil 4a3, an electrode pad 4a8, and an electrode pad 4a9.

The DCB substrate 4 is formed from at least the ceramic insulating substrate 4a1, first metal foil (circuit layer) 4a2, and second metal foil 4a3, wherein the first metal foil (circuit layer) 4a2 is disposed on the front surface of the ceramic insulating substrate 4a1, and the second metal foil 4a3 is disposed on the back surface of the ceramic insulating substrate 4a1.

The top surface of the first heat spreader 2a is joined through the solder 3a1 to the bottom surface of the first semiconductor element 1a. The bottom surface of the first heat spreader 2a is joined through the solder 3a2 to the top surface of the first metal foil (circuit layer) 4a2 of the DCB substrate 4.

The top surface of the second heat spreader 2b is joined through the solder 3b1 to the bottom surface of the second semiconductor element 1b. The bottom surface of the second heat spreader 2b is joined through the solder 3b2 to the top surface of the first metal foil (circuit layer) 4a2 of the DCB substrate 4.

Although not shown in FIG. 3, the first semiconductor unit 10a is formed such that one or both of the semiconductor elements 1a and 1b can include as an internal circuit a first sensor that measures either current or voltage, or a second sensor that measures temperature. The sensors can be connected by wire to the electrode pads 4a8 and 4a9, in which stand pins for extracting a signal to the exterior.

According to this kind of configuration, semiconductor element current, voltage, and temperature can be monitored.

Second Embodiment

A second embodiment according to the invention will be described. In the second embodiment, a semiconductor unit 10b is assembled in the semiconductor module with the aspect described in the first embodiment.

Figure 5:
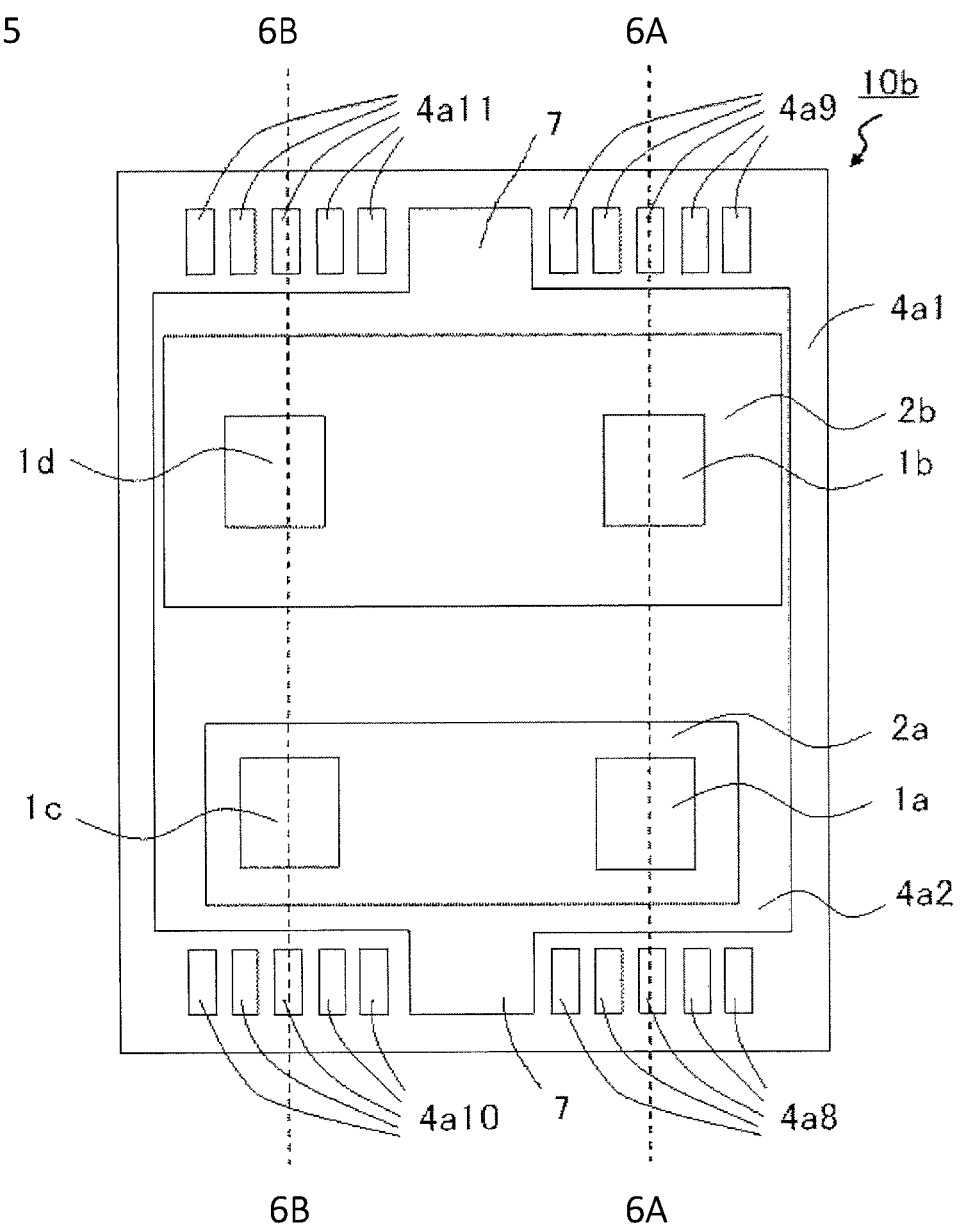
FIG. 5 is a plan view of another example of the semiconductor unit of the invention.
Figure 6A:
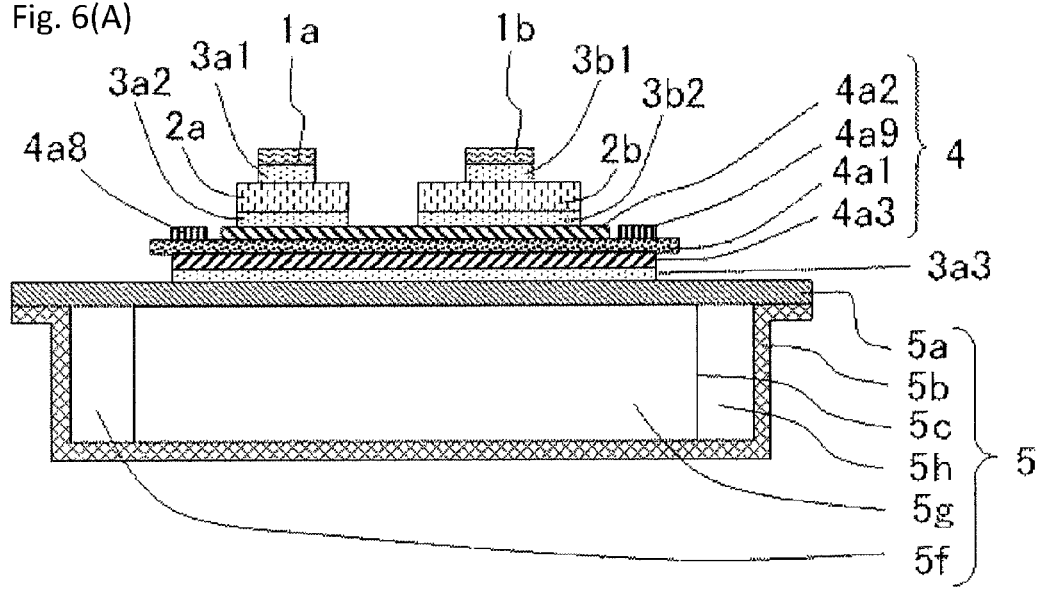
FIG. 6(A) is a sectional view along the line 6A-6A of the semiconductor unit shown in FIG. 5.
Figure 6B:
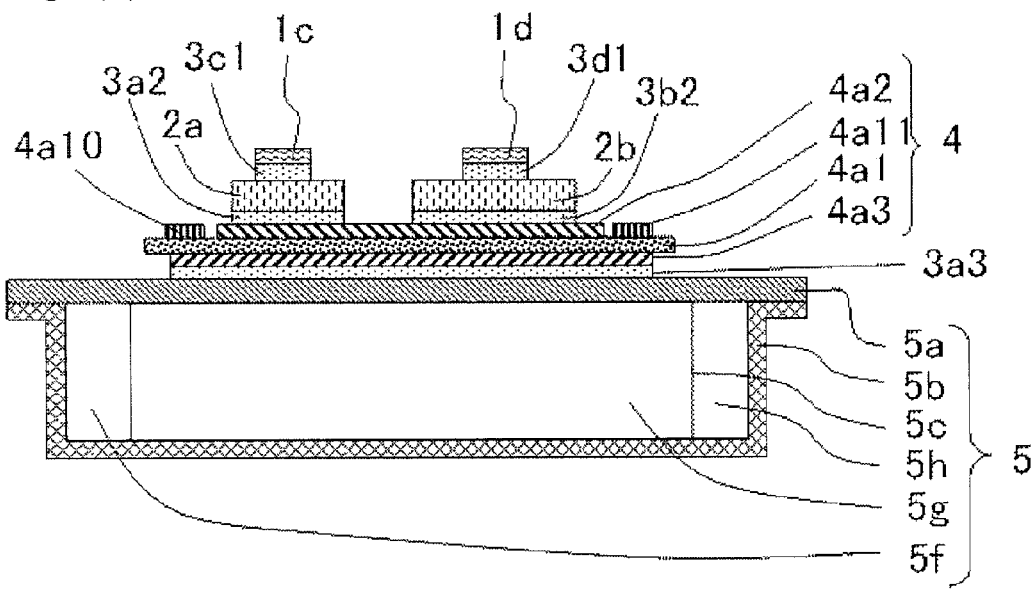
FIG. 6(B) is a sectional view along the line 6B-6B of the semiconductor unit shown in FIG. 5.

FIG. 5 shows a plan view of the semiconductor unit 10b according to the second embodiment of the invention. Also, FIG. 6(A) shows a sectional view along the line 6A-6A of the semiconductor unit 10b shown in FIG. 5 and the cooler 5, while FIG. 6(B) shows a sectional view along the line 6B-6B of the semiconductor unit 10b shown in FIG. 5 and the cooler 5.

As can be seen by comparing FIG. 3 and FIG. 5, main differences of the second embodiment from the first embodiment are that the first semiconductor element 1a in FIG. 3 is divided in FIG. 5 into the first semiconductor element 1a and a third semiconductor element 1c, that the second semiconductor element 1b in FIG. 3 is divided in FIG. 5 into the second semiconductor element 1b and a fourth semiconductor element 1d, and that an electrode pad 4a10 and an electrode pad 4a11 are added in FIG. 5.

The first semiconductor unit 10b includes the first semiconductor element 1a, second semiconductor element 1b, third semiconductor element 1c, fourth semiconductor element 1d, first heat spreader 2a, second heat spreader 2b, solder 3a1, solder 3a2, solder 3a3, solder 3b1, solder 3b2, solder 3c1, solder 3d1, the DCB substrate 4, ceramic insulating substrate 4a1, first metal foil (circuit layer) 4a2, second metal foil 4a3, electrode pad 4a8, electrode pad 4a9, electrode pad 4a10, and electrode pad 4a11.

The DCB substrate 4 is formed from at least the ceramic insulating substrate 4a1, first metal foil (circuit layer) 4a2, and second metal foil 4a3, wherein the first metal foil (circuit layer) 4a2 is disposed on the front surface of the ceramic insulating substrate 4a1, and the second metal foil 4a3 is disposed on the back surface of the ceramic insulating substrate 4a1.

The top surface of the first heat spreader 2a is joined through the solder 3a1 to the bottom surface of the first semiconductor element 1a, and furthermore, joined through the solder 3c1 to the bottom surface of the third semiconductor element 1c. The bottom surface of the first heat spreader 2a is joined through the solder 3a2 to the top surface of the first metal foil (circuit layer) 4a2 of the DCB substrate 4.

The top surface of the second heat spreader 2b is joined through the solder 3b1 to the bottom surface of the second semiconductor element 1b, and furthermore, joined through the solder 3d1 to the bottom surface of the fourth semiconductor element 1d. The bottom surface of the second heat spreader 2b is joined through the solder 3b2 to the top surface of the first metal foil (circuit layer) 4a2 of the DCB substrate 4.

Although not shown in FIG. 5, the first semiconductor unit 10b is formed such that one, or two or more, of the first semiconductor element 1a, second semiconductor element 1b, third semiconductor element 1c, and fourth semiconductor element 1d include as an internal circuit a first sensor that measures either current or voltage, and a second sensor that measures temperature, and a signal from the sensor can be extracted to the exterior via one of the electrode pad 4a8, electrode pad 4a9, electrode pad 4a10, or electrode pad 4a11.

Third Embodiment

A third embodiment according to the invention will be described. In the third embodiment, a semiconductor unit 10c is assembled in the semiconductor module with the aspect described in the first embodiment.

Figure 8A:
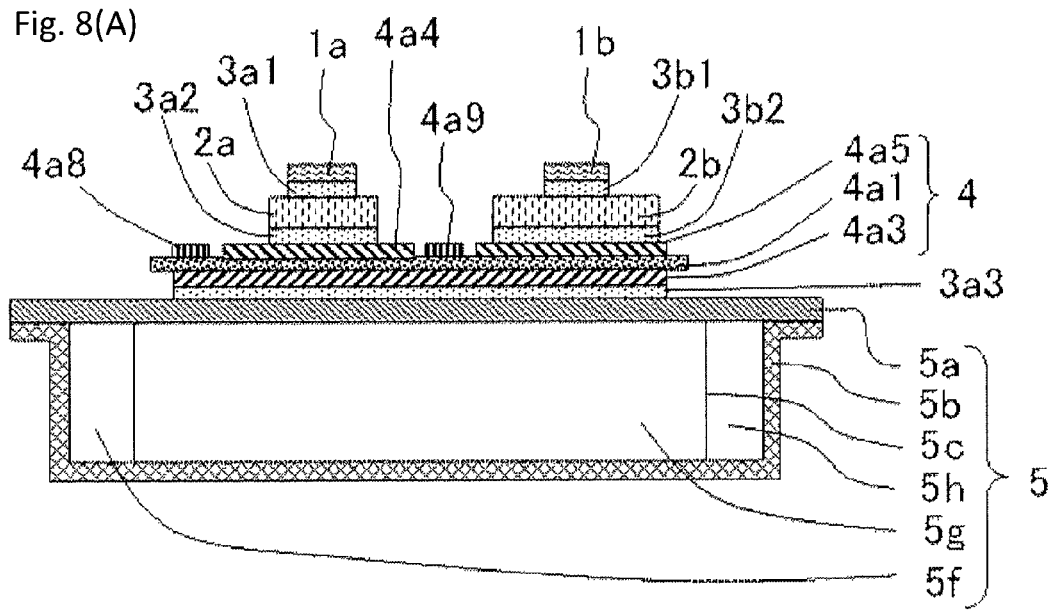
FIG. 8(A) is a sectional view along the line 8A-8A of the semiconductor unit shown in FIG. 7.
Figure 8B:
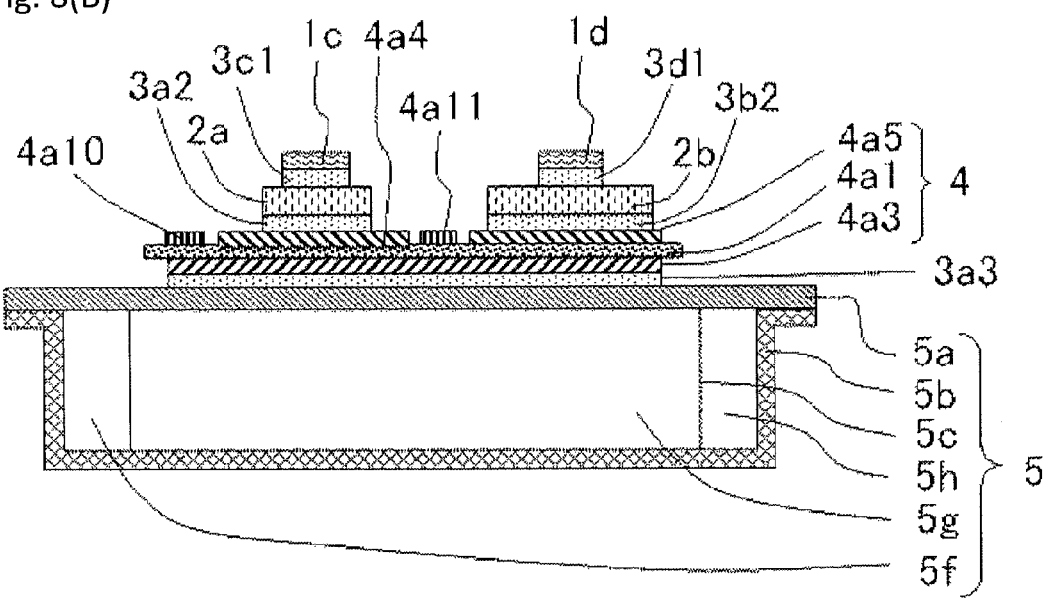
FIG. 8(B) is a sectional view along the line 8B-8B of the semiconductor unit shown in FIG. 7.

FIG. 7 shows a plan view of the semiconductor unit 10c according to the third embodiment of the invention. FIG. 8(A) shows a sectional view along the line 8A-8A of the semiconductor unit 10c shown in FIG. 7 and the cooler 5, while FIG. 8(B) shows a sectional view along the line 8B-8B of the semiconductor unit 10c shown in FIG. 7 and the cooler 5.

As can be seen by comparing FIG. 5 and FIG. 7, main differences of the third embodiment from the second embodiment are that the first metal foil (circuit layer) 4a2 in FIG. 5 is divided in FIG. 7 into a third metal foil 4a4 disposed on the bottom surface of the first heat spreader 2a and a fourth metal foil 4a5 disposed on the bottom surface of the second heat spreader 2b, that the first metal foil has an extending portion 7 protruding in a direction from downstream to upstream of the refrigerant flow in a region between a plurality of semiconductor elements electrically connected in parallel, and that the electrode pads 4a9 and 4a11 are disposed on the ceramic insulating substrate 4a1 between the first semiconductor element 1a and second semiconductor element 1b and between the third semiconductor element 1c and fourth semiconductor element 1d.

The first semiconductor unit 10c includes the first semiconductor element 1a, second semiconductor element 1b, third semiconductor element 1c, fourth semiconductor element 1d, first heat spreader 2a, second heat spreader 2b, solder 3a1, solder 3a2, solder 3a3, solder 3b1, solder 3b2, solder 3c1, solder 3d1, DCB substrate 4, ceramic insulating substrate 4a1, second metal foil 4a3, third metal foil (circuit layer) 4a4, fourth metal foil (circuit layer) 4a5, electrode pad 4a8, electrode pad 4a9, electrode pad 4a10, and electrode pad 4a11.

The extending portion 7 protruding in a direction from downstream to upstream of the refrigerant flow is provided in the fourth metal foil (circuit layer) 4a5 in a region between the third metal foil (circuit layer) 4a4, on which the first semiconductor element 1a and third semiconductor element 1c are disposed, and the fourth metal foil (circuit layer) 4a5, on which the second semiconductor element 1b and fourth semiconductor element 1d are disposed, and wiring can be connected thereto. By the extending portion 7 being provided in this position, the distance between the first semiconductor element 1a and third semiconductor element 1c and the distance between the second semiconductor element 1b and fourth semiconductor element 1d are maintained within limits, while avoiding the waste of space occurring when the extending portion 7 is disposed in another place, and a uniformity of temperature can be achieved.

The DCB substrate 4 is formed from at least the ceramic insulating substrate 4a1, third metal foil (circuit layer) 4a4, fourth metal foil (circuit layer) 4a5, and second metal foil 4a3, wherein the third metal foil (circuit layer) 4a4 and fourth metal foil (circuit layer) 4a5 are disposed on the front surface of the ceramic insulating substrate 4a1, and the second metal foil 4a3 is disposed on the back surface of the ceramic insulating substrate 4a1.

The top surface of the first heat spreader 2a is joined through the solder 3a1 to the bottom surface of the first semiconductor element 1a. Furthermore, the top surface of the first heat spreader 2a is joined through the solder 3c1 to the bottom surface of the third semiconductor element 1c. The bottom surface of the first heat spreader 2a is joined through the solder 3a2 to the top surface of the third metal foil (circuit layer) 4a4 of the DCB substrate 4.

The top surface of the second heat spreader 2b is joined through the solder 3b1 to the bottom surface of the second semiconductor element 1b. Furthermore, the top surface of the second heat spreader 2b is joined through the solder 3d1 to the bottom surface of the fourth semiconductor element 1d. The bottom surface of the second heat spreader 2b is joined through the solder 3b2 to the top surface of the fourth metal foil (circuit layer) 4a5 of the DCB substrate 4.

Although not shown in FIG. 7, the first semiconductor unit 10c is formed such that one, or two or more, of the first semiconductor element 1a, second semiconductor element 1b, third semiconductor element 1c, and fourth semiconductor element 1d include as an internal circuit a first sensor that measures either current or voltage, and a second sensor that measures temperature, and a signal from the sensor can be extracted to the exterior via one of the electrode pad 4a8, electrode pad 4a9, electrode pad 4a10, or electrode pad 4a11.

Fourth Embodiment

A fourth embodiment according to the invention will be described. In the fourth embodiment, a semiconductor unit 10d is assembled in the semiconductor module with the aspect described in the first embodiment.

Figure 10A:
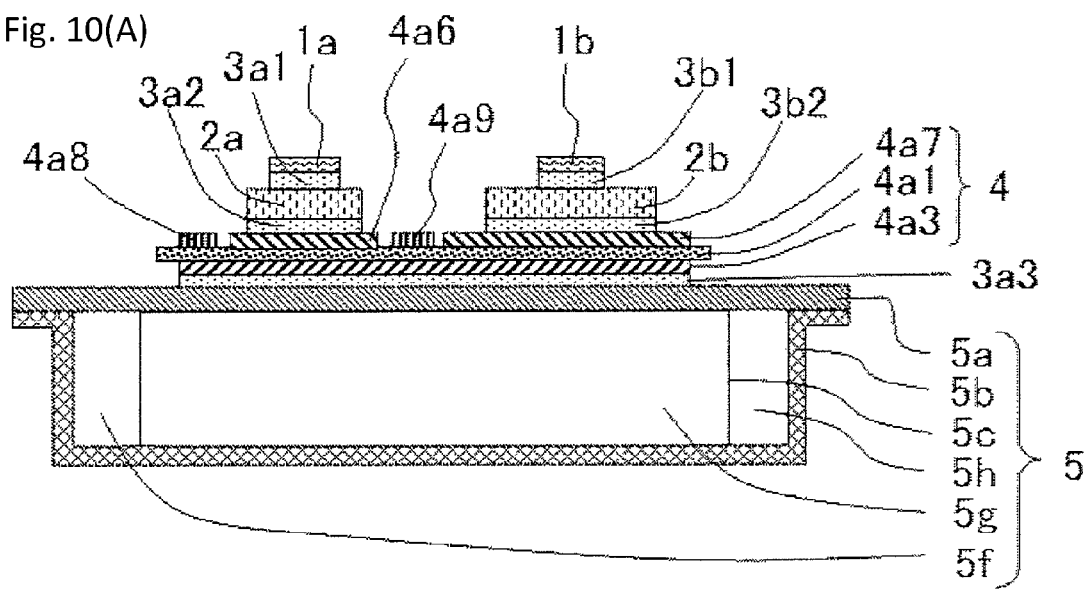
FIG. 10(A) is a sectional view along the line 10A-10A of the semiconductor unit shown in FIG. 9.
Figure 10B:
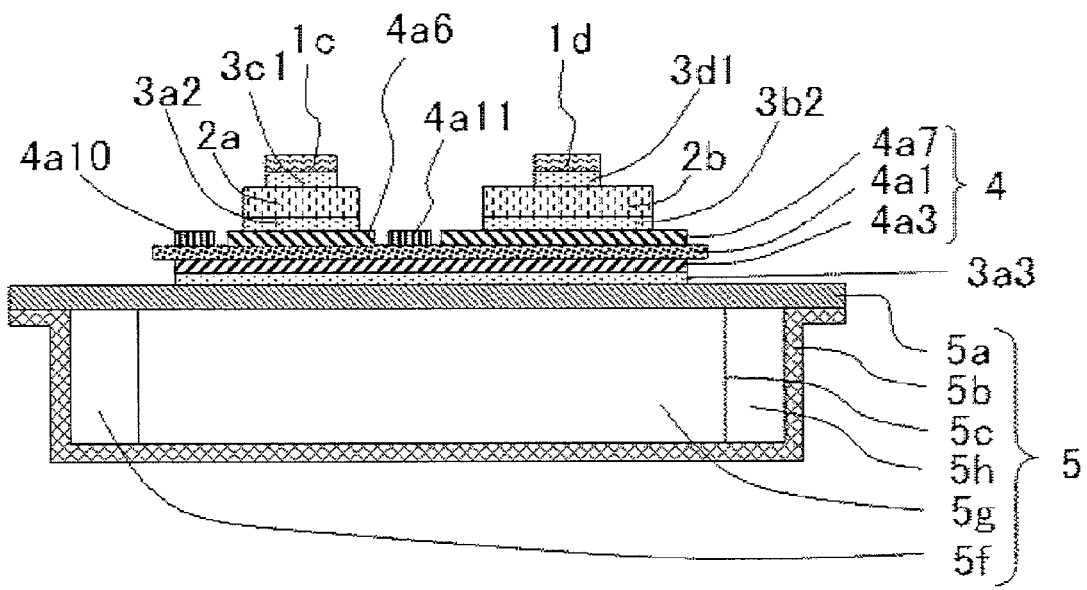
FIG. 10(B) is a sectional view along the line 10B-10B of the semiconductor unit shown in FIG. 9.

FIG. 9 shows a plan view of the semiconductor unit 10d according to the fourth embodiment of the invention. FIG. 10(A) shows a sectional view along the line 10A-10A of the semiconductor unit 10d shown in FIG. 9 and the cooler 5, while FIG. 10(B) shows a sectional view along the line 10B-10B of the semiconductor unit 10d shown in FIG. 9 and the cooler 5.

As can be seen by comparing FIG. 7 and FIG. 9, a main difference of the fourth embodiment from the third embodiment is that a fourth metal foil (circuit layer) 4a7 of FIG. 9 has an area larger than that of a third metal foil (circuit layer) 4a6.

As the area of the second heat spreader 2b is larger than the area of the first heat spreader 2a, to spread the heat from the heat spreaders more evenly, the area of the fourth metal foil (circuit layer) 4a7 below the second heat spreader 2b is larger than that of the third metal foil (circuit layer) 4a6 below the first heat spreader 2a.

The third metal foil (circuit layer) 4a6 and fourth metal foil (circuit layer) 4a7 are disposed on the ceramic insulating substrate 4a1. The top surface of the third metal foil (circuit layer) 4a6 is connected through the solder 3a2 to the bottom surface of the first heat spreader 2a. The top surface of the fourth metal foil (circuit layer) 4a7 is connected through the solder 3b2 to the bottom surface of the second heat spreader 2b.

As other points are the same as in the third embodiment, a description will be omitted.

Fifth Embodiment

A fifth embodiment according to the invention will be described. In the fifth embodiment, a semiconductor unit 10e is assembled in the semiconductor module with the aspect described in the first embodiment.

Figure 12A:
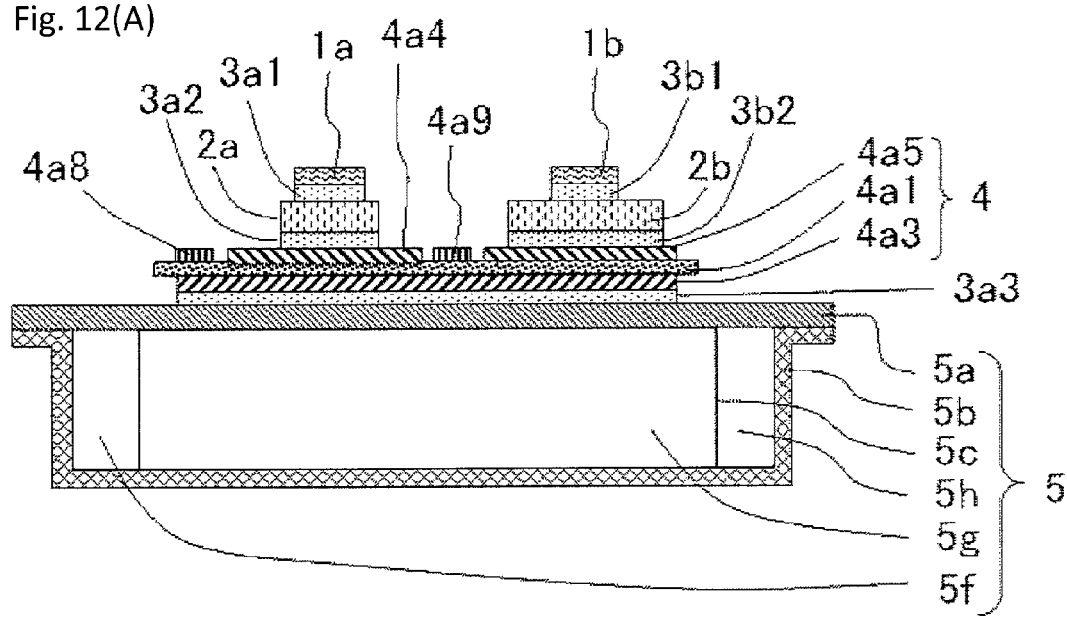
FIG. 12(A) is a sectional view along the line 12A-12A of the semiconductor unit shown in FIG. 11
Figure 12B:
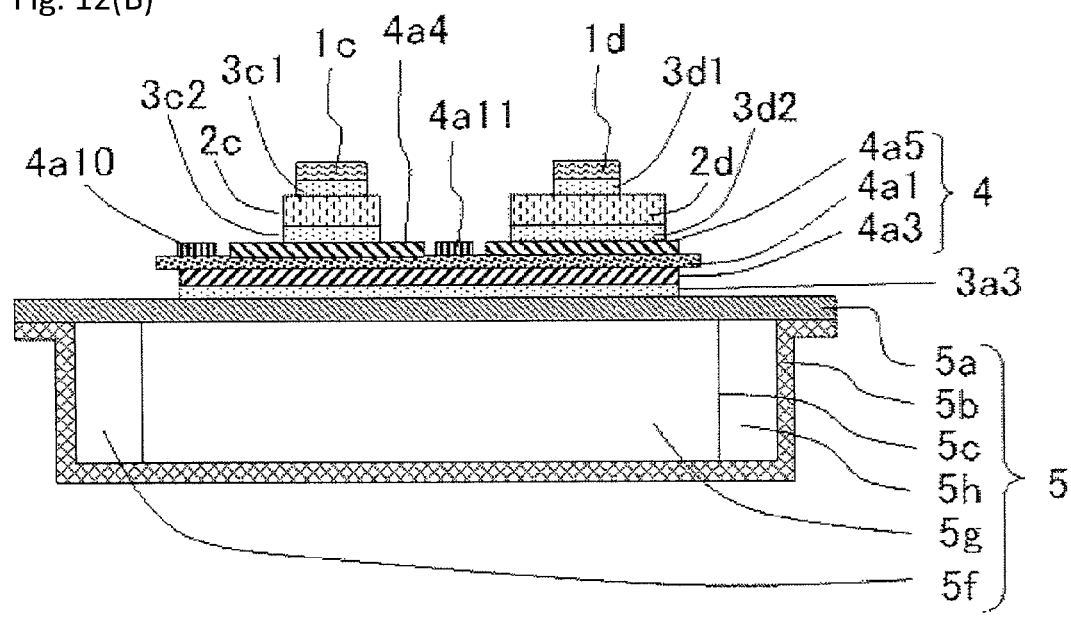
FIG. 12(B) is a sectional view along the line 12B-12B of the semiconductor unit shown in FIG. 11.

FIG. 11 shows a plan view of the semiconductor unit 10e according to the fifth embodiment of the invention. FIG. 12(A) shows a sectional view along the line 12A-12A of the semiconductor unit 10e shown in FIG. 11 and the cooler 5, while FIG. 12(B) shows a sectional view along the line 12B-12B of the semiconductor unit 10e shown in FIG. 11 and the cooler 5.

As can be seen by comparing FIG. 7 and FIG. 11, the main differences of the fifth embodiment from the third embodiment are that the first heat spreader 2a of FIG. 7 is divided in FIG. 11 into the first heat spreader 2a and a third heat spreader 2c, and that the second heat spreader 2b of FIG. 7 is divided in FIG. 11 into the second heat spreader 2b and a fourth heat spreader 2d.

The first heat spreader 2a is disposed through the solder 3a2 on the third metal foil (circuit layer) 4a4. The top surface of the first heat spreader 2a is connected through the solder 3a1 to the first semiconductor element 1a.

The second heat spreader 2b is disposed through the solder 3b2 on the fourth metal foil (circuit layer) 4a5. The top surface of the second heat spreader 2b is connected through the solder 3b1 to the second semiconductor element 1b.

The third heat spreader 2c is disposed through the solder 3c2 on the third metal foil (circuit layer) 4a4. The top surface of the third heat spreader 2c is connected through the solder 3c1 to the third semiconductor element 1c.

The fourth heat spreader 2d is disposed through the solder 3d2 on the fourth metal foil (circuit layer) 4a5. The top surface of the fourth heat spreader 2d is connected through the solder 3d1 to the fourth semiconductor element 1d.

As other points are the same as in the third embodiment, a description will be omitted.

(Simulated Heat Transfer Analysis)

As the heat transfer characteristics of the semiconductor module of the invention have been analyzed by simulation, the results thereof will be described.

As shown in FIG. 2, the semiconductor units 10, 11, and 12 including four semiconductor elements in one semiconductor unit are disposed above the cooler 5 so as to be parallel to the refrigerant flow direction 14.

Figures 13, 14:
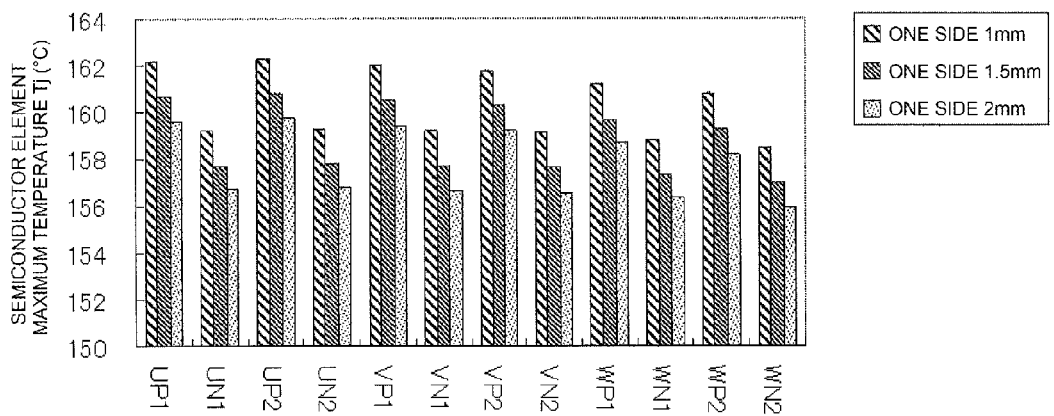
FIG. 13 is a diagram representing results of a simulation whereby the area of a heat spreader is increased with the heat spreader thickness at 1 mm.
FIG. 14 is a diagram showing the relationship between the distance from the top surface of a ceramic insulating substrate to the top surface of a second heat spreader and a semiconductor element maximum temperature Tj.

FIG. 13 shows a semiconductor element maximum temperature Tj for each semiconductor element calculated when changing the distance from an end of each semiconductor element to an end of the heat spreader to 1 mm, 1.5 mm, and 2 mm in the case of the rectangular heat spreaders disposed on the upstream side and downstream side. In the simulation of FIG. 13, the thickness of the heat spreaders is fixed at 1 mm. The four semiconductor elements of the semiconductor unit 12 are represented by reference sign names UP1, UN1, UP2, and UN2. UP1 and UP2 are downstream side semiconductor elements, while UN1 and UN2 are upstream side semiconductor elements. In the same way, the four semiconductor elements of the semiconductor unit 11 are represented by reference sign names VP1, VN1, VP2, and VN2. VP1 and VP2 are downstream side semiconductor elements, while VN1 and VN2 are upstream side semiconductor elements. The four semiconductor elements of the semiconductor unit 10 are represented by reference sign names WP1, WN1, WP2, and WN2. WP1 and WP2 are downstream side semiconductor elements, while WN1 and WN2 are upstream side semiconductor elements. The greater the distance from the end of each semiconductor element to the end of the heat spreader, the more the area of the heat spreader increases, and in all the semiconductor elements, the maximum temperature Tj is reduced. When the distance is 1 mm, the average temperature of the upstream side semiconductor elements is 159.0° C., while the average temperature of the downstream side semiconductor elements is 161.7° C. When the distance is 1.5 mm, the average temperature of the upstream side semiconductor elements is 157.5° C., while the average temperature of the downstream side semiconductor elements is 160.2° C. When the distance is 2 mm, the average temperature of the upstream side semiconductor elements is 156.5° C., while the average temperature of the downstream side semiconductor elements is 159.2° C. In this way, there is a tendency for the temperature of the downstream side semiconductor elements to be higher than that of the upstream side semiconductor elements.

FIG. 14 shows the relationship between the distance from the top surface of the ceramic insulating substrate to the top surface of the second heat spreader and the semiconductor element maximum temperature Tj. The greater the distance from the top surface of the ceramic insulating substrate to the top surface of the second heat spreader, the further the semiconductor element maximum temperature Tj can be reduced, but this is not desirable as the volume of the heat spreader increases and the weight increases, leading to increased material costs. Therefore, it is desirable that the distance from the top surface of the ceramic insulating substrate to the top surface of the first heat spreader, and the distance from the top surface of the ceramic insulating substrate to the top surface of the second heat spreader, are each between 0.8 mm or more and 2.5 mm or less, and more desirable that the distances are each between 1.5 mm or more and 2.0 mm or less. For the simulation on this occasion, it is assumed that solder is used for joining the metal foils and heat spreaders, but not being limited to this, for example, the metal foils and heat spreaders may be joined by disposing a paste including nano-particles of silver in resin between a metal foil and heat spreader and sintering the paste in a reflow oven, or may be joined directly by brazing.

Figure 15:
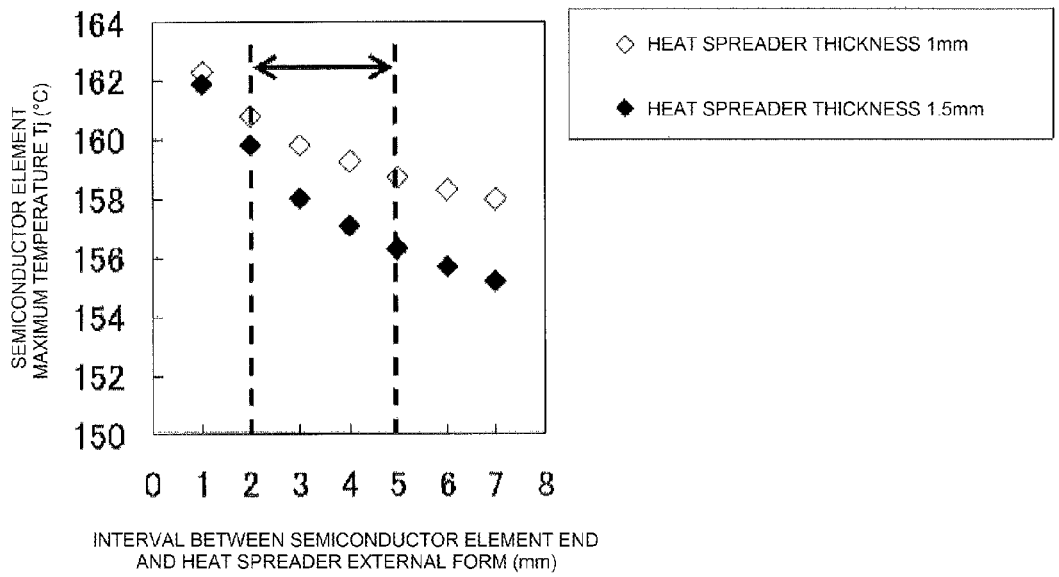
FIG. 15 is a diagram representing the results of a simulation whereby the heat spreader area is increased in the cases of heat spreaders of 1 mm and 1.5 mm thicknesses.

FIG. 15 is a diagram representing the results of a simulation whereby the heat spreader area is increased in the cases of heat spreaders of 1 mm and 1.5 mm thicknesses. When the interval between the end of the semiconductor element and the external form of the heat spreader increases, the size of the heat spreader increases, and the heat transfer area also increases. It is desirable that the interval between the end of the semiconductor element and the external form of the heat spreader is between 2 mm or more and 5 mm or less. When the interval is less than 2 mm, the semiconductor element maximum temperature Tj increases, and the semiconductor element cannot be sufficiently cooled. The interval exceeding 5 mm is not desirable as the heat spreader becomes large, because of which the device becomes heavy, and material costs increase. A case wherein the temperature cannot be reduced by a ratio of 1° C. for each 1 mm of interval between the end of the semiconductor element and the external form of the heat spreader is an undesirable condition because of the disadvantage described above. For example, when comparing with the thickness of the heat spreader as a parameter, it is observed that the temperature can be reduced further when the thickness is 1.5 mm than when the thickness is 1 mm. Based on this, the thickness and the like of the heat spreader can be optimized.

Hereafter, a description will be given of the results of optimizing with 154° C. as the target temperature of the semiconductor element maximum temperature Tj.

Figure 16:
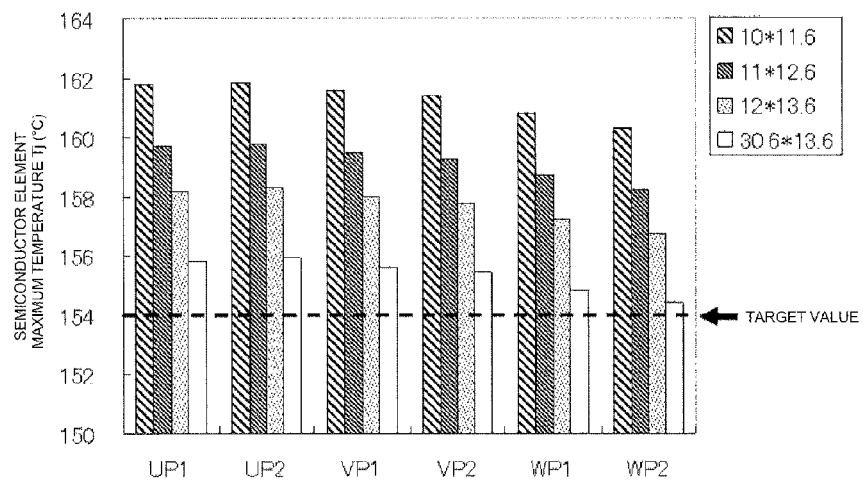
FIG. 16 is a diagram representing the results of a simulation whereby the width of the heat spreader is increased in a direction perpendicular to the refrigerant flow direction.

FIG. 16 shows only downstream side simulation results from among results of a simulation whereby the width of the heat spreader is increased in a direction perpendicular to the refrigerant flow direction. Numerals 10×11.6, 11×12.6, 12×13.6, and 30.6×13.6 in the key represent the heat spreader (horizontal length)×(vertical length), wherein (horizontal length) refers to the length of the heat spreader in the direction perpendicular to the refrigerant flow direction. The unit of length is millimeters. In the cases of 10×11.6, 11×12.6, and 12×13.6 in the key, one semiconductor element is disposed on one heat spreader. When comparing 12×13.6 and 30.6×13.6 in the key, it is seen that the greater the length of the heat spreader in the direction perpendicular to the refrigerant flow direction, the further the semiconductor element maximum temperature Tj can be reduced. In the case of 30.6×13.6 in the key, the semiconductor element is divided into two elements, which are disposed in parallel on one heat spreader. When dividing into two and disposing in parallel, thereby widening the heat spreader, it is seen that the heat flow can be efficiently widened, and the maximum temperature Tj can thus be further reduced.

Figure 17:
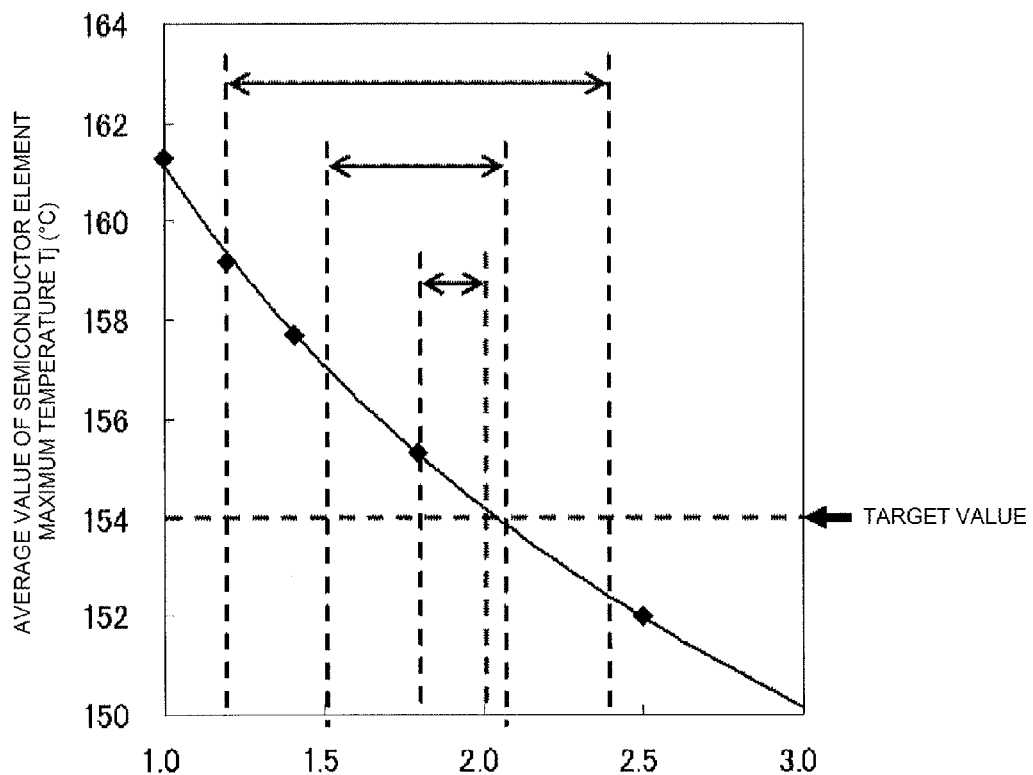
FIG. 17 is a diagram showing the average value of the semiconductor element maximum temperature Tj in relationship to the ratio of a downstream side heat spreader area with respect to an upstream side heat spreader area.

FIG. 17 shows the relationship between the ratio of the downstream side heat spreader area with respect to the upstream side heat spreader area and the average value of the semiconductor element maximum temperature Tj, based on the data of FIG. 16. It is observed that it is desirable that the area ratio is between 1.2 times or more and 2.4 times or less, more desirable that the area ratio is between 1.5 times or more and 2.1 times or less, and even more desirable that the area ratio is between 1.8 times or more and 2.0 times or less. When the area ratio is less than 1.2 times, the average value of the downstream side semiconductor element maximum temperature Tj cannot be sufficiently reduced. It is observed that the ratio exceeding 2.4 times is not desirable, as the area of the downstream side heat spreader increases, the size of the device also increases.

Figure 18:
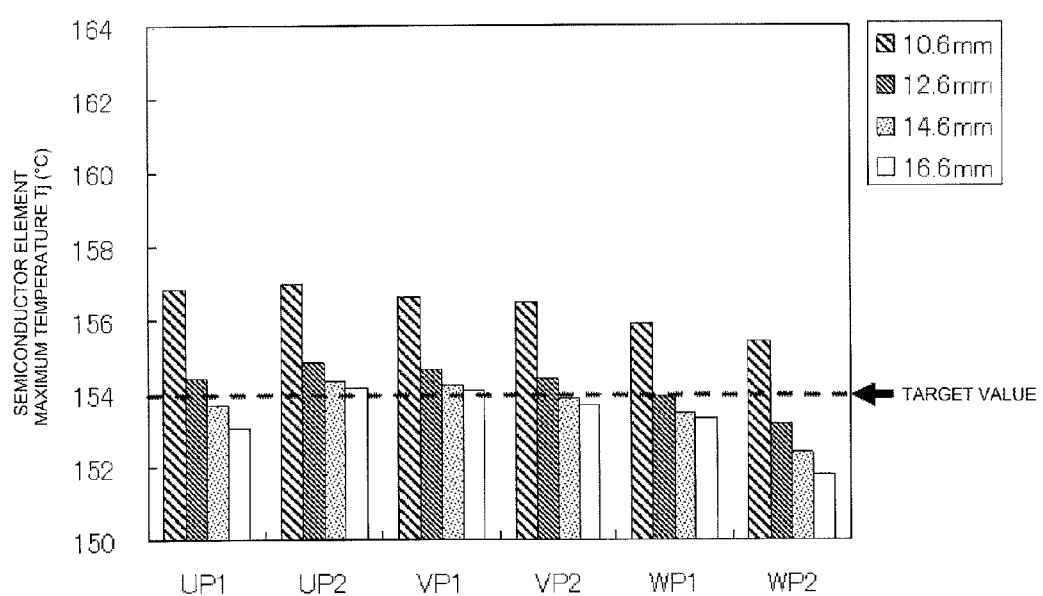
FIG. 18 is a diagram showing the results of a simulation whereby the interval between semiconductor elements is increased in the direction perpendicular to the refrigerant flow direction.

FIG. 18 shows the results of a simulation whereby the interval between semiconductor elements is increased in the direction perpendicular to the refrigerant flow direction. The simulation is carried out by increasing the interval between semiconductor elements in increments of 2 mm, but it is observed that the effect when increasing from 10.6 mm to 12.6 mm is greater than when increasing to a value greater than 12.6 mm. The smaller the interval between semiconductor elements, the further the size of the device can be reduced, because of which it is observed to be desirable that the interval between semiconductor elements is 13 mm or less, and more desirable that the interval is 12.6 mm.

Figure 19:
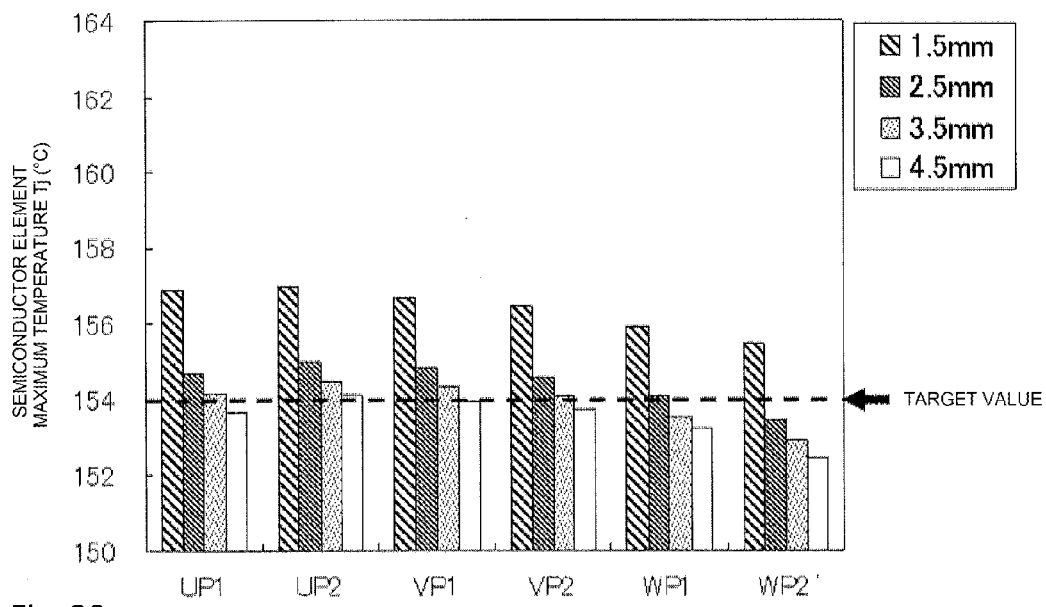
FIG. 19 is a diagram showing the results of a simulation whereby the distance between an end of the semiconductor element and an end of the heat spreader is increased in the direction of the downstream heat spreader perpendicular to the refrigerant flow direction.

FIG. 19 shows the results of the distance between the end of the semiconductor element and the end of the heat spreader being changed in increments of 1 mm from 1.5 mm to 2.5 mm, 3.5 mm, and 4.5 mm in the direction of the downstream heat spreader perpendicular to the refrigerant flow direction, and the semiconductor element maximum temperature Tj being calculated. It is observed that the temperature change between 1.5 mm and 2.5 mm is the greatest, and that the semiconductor element maximum temperature Tj cannot be greatly reduced by further increasing the distance beyond 2.5 mm. As the semiconductor module becomes large when the interval between semiconductor elements is increased too far, it is observed that, taking trade-off into consideration, 2.5 mm is desirable.

Figure 20:
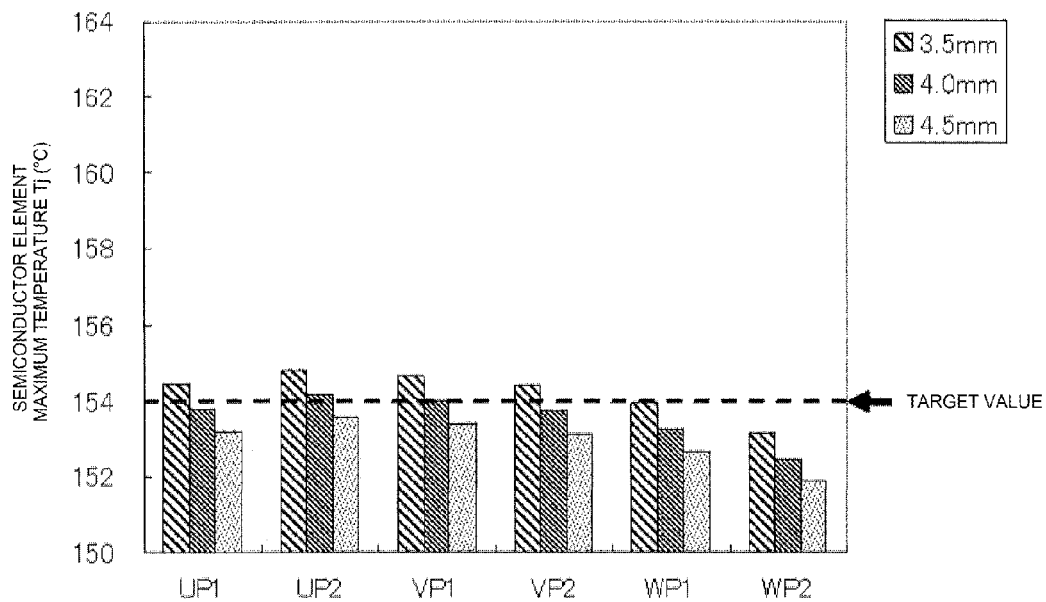
FIG. 20 is a diagram showing the results of a simulation whereby the distance between the end of the semiconductor element and the end of the heat spreader is increased in the refrigerant flow direction of the downstream heat spreader.

FIG. 20 shows the results of a simulation whereby the distance between the end of the semiconductor element and the end of the heat spreader is increased in the refrigerant flow direction of the downstream heat spreader. It is observed that the greater the distance between the end of the semiconductor element and the end of the heat spreader, the further the semiconductor element maximum temperature Tj can be reduced. It is observed that in order to achieve the target value or less, a distance of 4.5 mm is desirable.

In the examples of the invention, the heat spreaders, first metal foil, third metal foil, and fourth metal foil are provided separately, but these components may be formed by one metal plate of a thickness wherein the heat spreaders and metal foils are integrated being processed by etching.

Sixth Embodiment

Next, referring to FIG. 21 and FIG. 22, an embodiment of an electrically-driven vehicle in which the semiconductor module of the invention is used will be described.

Figure 21:
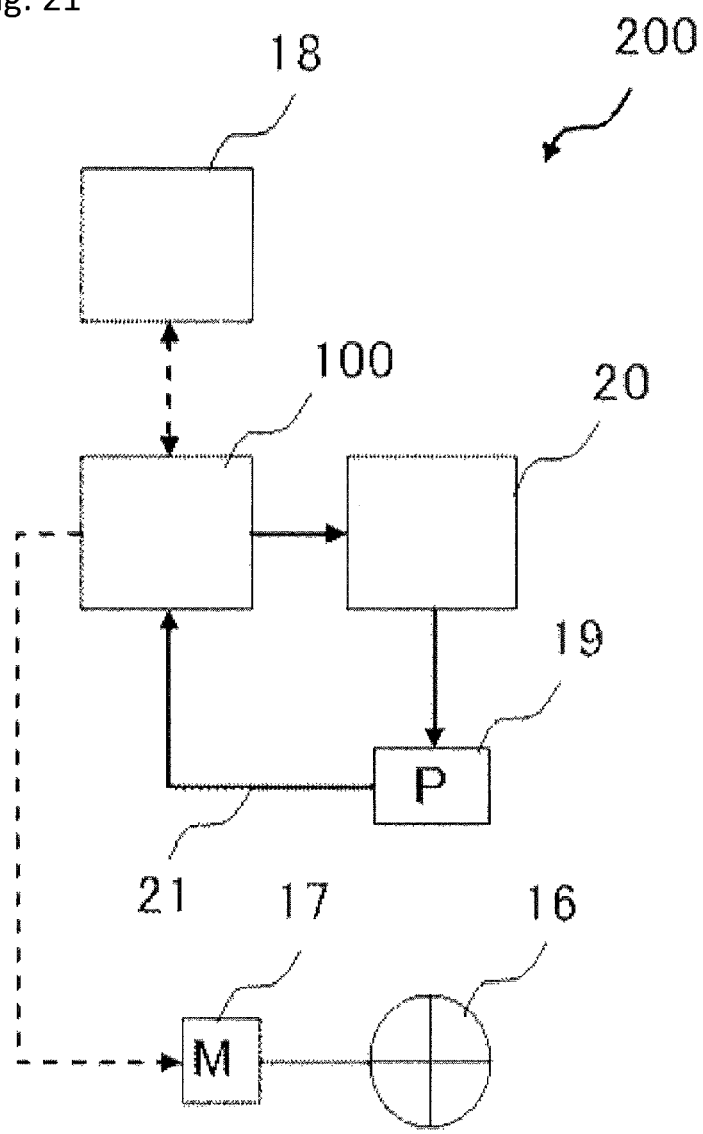
FIG. 21 is an outline configuration diagram of an example of a drive system of an electrically-driven vehicle of the invention.

FIG. 21 is an outline configuration diagram of a drive system of an electrically-driven vehicle. An electrically-driven vehicle 200 includes at least any one of the heretofore described semiconductor modules 100, a motor 17 driven by power output by the semiconductor module 100, a central processing unit 18 that controls the semiconductor module 100, a pump 19 that transports refrigerant that cools the semiconductor module 100, a heat exchanger 20 that cools the refrigerant, and piping 21 that connects the semiconductor module 100, pump 19, and heat exchanger 20 in closed circuit form, thereby forming a refrigerant path. The motor 17 causes a wheel 16 to rotate using a mechanism that mechanically causes driving force to be transmitted to the wheel 16.

Figure 22:
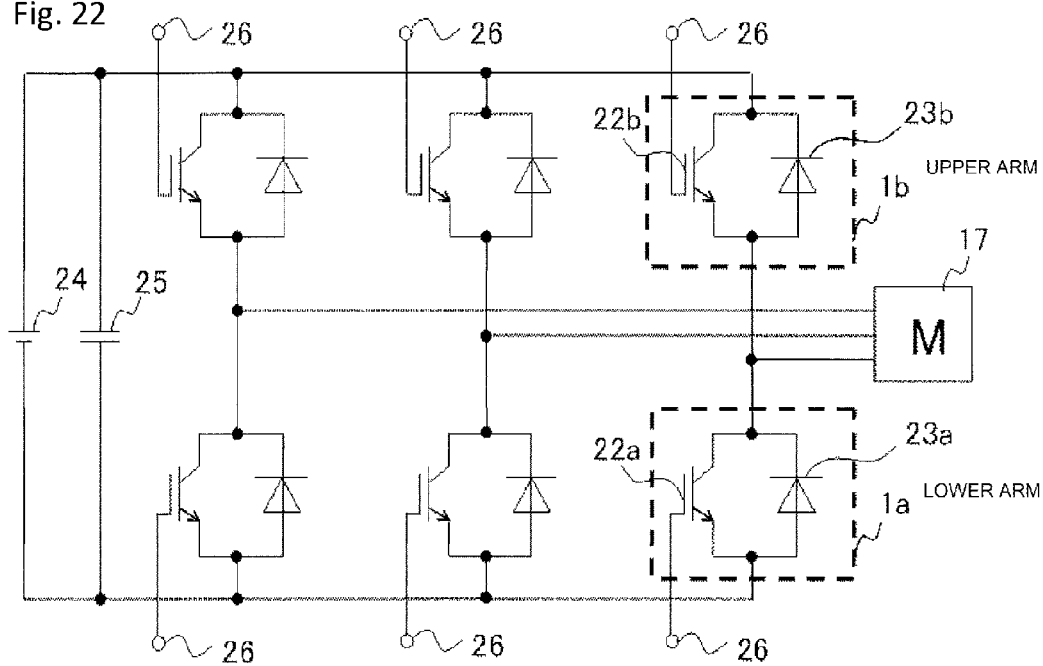
FIG. 22 is a circuit diagram showing an example of an inverter of the semiconductor module of the invention.

FIG. 22 is a circuit diagram of an inverter of the semiconductor module according to the sixth embodiment of the invention. The circuit diagram, relating to the semiconductor module of FIG. 3, shows an example wherein RC-IGBTs are used as the semiconductor element 1a and semiconductor element 1b. The RC-IGBT is formed such that an IGBT 22a and an FWD 23a are connected in parallel and incorporated in the interior of one semiconductor element 1a. In the same way, an IGBT 22b and an FWD 23b are incorporated connected in parallel in the interior of the semiconductor element 1b.

The semiconductor element 1a and semiconductor element 1b are connected in series. The other end of the semiconductor element 1a and the other end of the semiconductor element 1b are each connected to a battery 24. A capacitor 25 is connected between the two terminals of the battery 24. Output wiring is connected from wiring between the semiconductor element 1a and semiconductor element 1b to the motor 17. With the semiconductor element 1a and semiconductor element 1b as one set, a total of three sets are installed, and output wiring emerging from each set is connected to the 3-phase motor 17. A control signal input terminal 26 is connected to the gate of each semiconductor element, and is also connected to the external central processing unit 18. By signals input into the gate of each semiconductor element being switched in the central processing unit 18, direct current supplied from the battery 24 is converted into 3-phase alternating current output to the motor 17.

In the example, one semiconductor element is disposed on the heat spreader, but as another modification example, a plurality of semiconductor elements may be disposed in parallel on the heat spreader, as shown in FIG. 5, FIG. 7, FIG. 9, and FIG. 11.

The electrically-driven vehicle in which the semiconductor module of the invention is used is formed such that the first semiconductor element is disposed on the upstream side with respect to the cooler refrigerant flow direction, the second semiconductor element is disposed on the downstream side, and the area of the second heat spreader is greater than the area of the first heat spreader, because of there are excellent advantages in that cooling capacity is higher than that of a conventional semiconductor module, and the semiconductor module is more compact. Therefore, the cooler is also more compact, the rigidity of the cooler increases, and the cooler is resistant to vibration occurring due to movement of the electrically-driven vehicle.

In this way, according to the embodiments of the invention, it is possible to provide a semiconductor module, and an electrically-driven vehicle in which the semiconductor module is used, such that cooling capacity can be improved.

REFERENCE SIGNS LIST

1a First semiconductor element
1b Second semiconductor element
1c Third semiconductor element
1d Fourth semiconductor element
2a First heat spreader
2b Second heat spreader
2c Third heat spreader
2d Fourth heat spreader
3a1, 3a2, 3a3, 3b1, 3b2, 3c1, 3c2, 3d1, 3d2 Solder
4 DCB substrate
4a1 Ceramic insulating substrate
4a2 First metal foil (circuit layer)
4a3 Second metal foil
4a4, 4a6 Third metal foil (circuit layer)
4a5, 4a7 Fourth metal foil (circuit layer)
4a8, 4a9, 4a10, 4a11 Electrode pad
5 Cooler
5a Top plate
5b Tray
5c Fin
5d Refrigerant inlet piping
5e Refrigerant outlet piping
5f Distribution portion
5g Refrigerant path
5h Collection portion
7 Extending portion
10, 10a, 10b, 10c, 10d, 10e First semiconductor unit
11 Second semiconductor unit
12 Third semiconductor unit
13 Refrigerant introduction direction
14 Refrigerant flow direction
15 Refrigerant discharge direction 16 Wheel
17 Motor
18 Central processing unit
19 Pump
20 Heat exchanger
21 Piping
22a, 22b IGBT
23a, 23b FWD
24 Battery
25 Capacitor
26 Control signal input terminal
100 Semiconductor module
200 Electrically-driven vehicle

What is claimed is:

1. A semiconductor module, comprising:
a first semiconductor element;
a second semiconductor element;
a first heat spreader electrically and thermally connected to a bottom surface of the first semiconductor element;
a second heat spreader electrically and thermally connected to a bottom surface of the second semiconductor element;
a DCB substrate including a ceramic insulating substrate, a first metal foil disposed on a top surface of the ceramic insulating substrate to electrically and thermally join to a bottom surface of the first heat spreader and a bottom surface of the second heat spreader, and a second metal foil disposed on a bottom surface of the ceramic insulating substrate; and
a cooler thermally connected to the second metal foil of the DCB substrate,
wherein the first semiconductor element is disposed on an upstream side and the second semiconductor element is disposed on a downstream side with respect to a flowing direction of a refrigerant of the cooler, and
an area of the second heat spreader is greater than an area of the first heat spreader.

2. The semiconductor module according to claim 1, wherein a length of the second heat spreader in a direction perpendicular to the flowing direction of the refrigerant is greater than a length of the first heat spreader in the direction perpendicular to the flowing direction of the refrigerant.

3. The semiconductor module according to claim 1, wherein a length of the second heat spreader in the flowing direction of the refrigerant is greater than a length of the first heat spreader in the flowing direction of the refrigerant.

4. The semiconductor module according to claim 1, wherein the first metal foil includes a third metal foil disposed on the bottom surface of the first heat spreader and a fourth metal foil disposed on the bottom surface of the second heat spreader.

5. The semiconductor module according to claim 1, wherein at least one of the first semiconductor element and the second semiconductor element includes a plurality of semiconductor elements disposed to be electrically connected in parallel.

6. The semiconductor module according to claim 5, wherein at least one of the first heat spreader and the second heat spreader is formed from a plurality of heat spreaders corresponding to the semiconductor elements for the plurality of semiconductor elements disposed to be electrically connected in parallel.

7. The semiconductor module according to claim 5, wherein the first metal foil includes an extending portion protruding in a direction from downstream to upstream of the refrigerant flow in a region between the plurality of semiconductor elements electrically connected in parallel.

8. The semiconductor module according to claim 1, further comprising an electrode pad disposed on the ceramic insulating substrate between the first semiconductor element and the second semiconductor element.

9. The semiconductor module according to claim 1, wherein the first heat spreader has an external form in which a distance from an edge of the first heat spreader to an edge of the first semiconductor element is in a range between 2 mm or more and 10 mm or less, and
the second heat spreader has an external form in which a distance from an edge of the second heat spreader to an edge of the second semiconductor element is within a range between 2 mm or more and 10 mm or less.

10. The semiconductor module according to claim 1, wherein each of a distance from the top surface of the ceramic insulating substrate to a top surface of the first heat spreader and a distance from the top surface of the ceramic insulating substrate to a top surface of the second heat spreader is between 0.8 mm or more and 2.5 mm or less,
the first heat spreader has an external form in which a distance from an edge of the first heat spreader to an edge of the first semiconductor element is between 2 mm or more and 5 mm or less, and
the second heat spreader has an external form in which a distance from an edge of the second heat spreader to an edge of the second semiconductor element is between 2 mm or more and 5 mm or less.

11. The semiconductor module according to claim 1, wherein each of a distance from the top surface of the ceramic insulating substrate to a top surface of the first heat spreader and a distance from the top surface of the ceramic insulating substrate to a top surface of the second heat spreader is between 1.5 mm or more and 2.0 mm or less,
the first heat spreader has an external form in which a distance from an edge of the first heat spreader to an edge of the first semiconductor element is between 2 mm or more and 5 mm or less, and
the second heat spreader has an external form in which a distance from an edge of the second heat spreader to an edge of the second semiconductor element is between 2 mm or more and 5 mm or less.

12. The semiconductor module according to claim 5, wherein a distance between one edge of one of the plurality of first semiconductor elements and one edge of another of the plurality of first semiconductor elements facing the one edge of the one of the plurality of first semiconductor elements is between 1 mm or more and 13 mm or less, or
a distance between one edge of one of the plurality of second semiconductor elements and one edge of another of the plurality of second semiconductor elements facing the one edge of the one of the plurality of second semiconductor elements is between 1 mm or more and 13 mm or less.

13. The semiconductor module according to claim 1, wherein at least one of the first semiconductor element and second semiconductor element includes a first sensor for measuring either a current or voltage and a second sensor for measuring a temperature.

14. The semiconductor module according to claim 1, wherein the area of the second heat spreader is increased in a range between 1.2 times or more of the area of the first heat spreader and 2.4 times or less of the area of the first heat spreader.

15. The semiconductor module according to claim 14, wherein the area of the second heat spreader is increased in a range between 1.5 times or more of the area of the first heat spreader and 2.1 times or less of the area of the first heat spreader.

16. The semiconductor module according to claim 15, wherein the area of the second heat spreader is increased in a range between 1.8 times or more of the area of the first heat spreader and 2.0 times or less of the area of the first heat spreader.

17. An electrically-driven vehicle, comprising:
a semiconductor module according to claim 1;
a motor driven by power output from the semiconductor module;
a central processing unit controlling the semiconductor module;
a pump for transporting a refrigerant for cooling the semiconductor module;
a heat exchanger for cooling the refrigerant; and
a piping connecting the semiconductor module, the pump, and the heat exchanger in closed circuit form to form a refrigerant path.

* * * * *